(12) United States Patent  (10) Patent No.: US 7,813,118 B2
Burge  (45) Date of Patent: Oct. 12, 2010

(54) DEVICE BRACKET WITH INTEGRATED DEVICE HUB

(75) Inventor: Benjamin Douglass Burge, Shaker Heights, OH (US)

(73) Assignee: Bose Corporation, Framingham, MA (US)

( * ) Notice: Subject to any disclaimer, the term of this patent is extended or adjusted under 35 U.S.C. 154(b) by 134 days.

(21) Appl. No.: 12/102,385

(22) Filed: Apr. 14, 2008

(65) Prior Publication Data

US 2009/0257201 A1    Oct. 15, 2009

(51) Int. Cl.
H05K 7/14 (2006.01)
(52) U.S. Cl. .............. 361/679.41; 361/679.21; 361/679.22; 361/729; 361/825; 710/300
(58) Field of Classification Search ........... 361/679.21, 361/679.22, 679.41, 729, 825; 710/300–306
See application file for complete search history.

(56) References Cited

U.S. PATENT DOCUMENTS

| | | | |
|---|---|---|---|
| 3,512,605 | A | 5/1970 | McCorkle |
| 5,852,545 | A | 12/1998 | Pan-Ratzlaff |
| 6,050,849 | A * | 4/2000 | Chang .................. 439/536 |
| 6,275,375 | B1 | 8/2001 | Nam et al. |
| 7,057,662 | B2 * | 6/2006 | Malzbender ............ 348/373 |
| 7,061,754 | B2 * | 6/2006 | Moscovitch ........... 361/679.21 |
| 7,145,767 | B2 * | 12/2006 | Mache et al. ......... 361/679.21 |
| 7,594,823 | B2 * | 9/2009 | Moscovitch ............ 439/374 |
| 2002/0027613 | A1 | 3/2002 | Tajima |
| 2003/0001055 | A1 | 1/2003 | Harary et al. |
| 2003/0015632 | A1 * | 1/2003 | Dunn et al. ............ 248/122.1 |
| 2003/0156075 | A1 | 8/2003 | Motoyama et al. |
| 2004/0019732 | A1 * | 1/2004 | Overtoom et al. ......... 710/313 |
| 2005/0146251 | A1 | 7/2005 | Gillengerten |
| 2009/0230263 | A1 * | 9/2009 | Burge ................ 248/220.1 |

FOREIGN PATENT DOCUMENTS

FR    2536644 A1    6/1984

OTHER PUBLICATIONS

International Search Report and Written Opinion dated Jun. 29, 2009 for PCT/US2009037241.
Ergotron, Inc. product guide; Change the way you view the world, Flat panel monitor, notebook, tablet PC and LCD TV mounting and mobility products; vol. 4, No. 2, Sep. 17, 2008.
Ergotron, Inc. product guide; Adjustable Office Display Mounts, Increase Comfort and Productivity, Jul. 31, 2007.

(Continued)

*Primary Examiner*—Jayprakash N Gandhi
*Assistant Examiner*—Ingrid Wright

(57) ABSTRACT

An device bracket for mounting devices to a flat panel display incorporates a device hub able to form a network with devices coupled to it where the device hub associates one or more physical characteristics to devices coupled to it, including locality, orientation and position relative to the device hub. The device hub is conveys data indicating these physical characteristics associated with these devices to one or more of the devices coupled to it, thereby either enabling the devices with those physical characteristics to modify the manner in which they perform their own functions in response to those physical characteristics, or enabling other devices to modify data that they exchange with the devices having those physical characteristics in response to those physical characteristics.

31 Claims, 25 Drawing Sheets

OTHER PUBLICATIONS

9X Media Product Overview; Expand Your Vision, The World's Most Advanced Multi-Screen Solutions, CA, USA, Copyright 2001-2004.

9X Media Product Overview; Expand Your Vision, Video Wall Installations, CA, USA. Retrieved from www.9Xmedia.com, Sep. 22, 2008.

PoweredUSB.org, An Informational Web Site; Retail USB, USB PlusPower, USB +Power; Electro-Mechanocal Specification Version 0.8, Powered USB Electro/Mechanical, 2005.

Vantage Point Products Corporation; About VESA Standard, VESA Mount for LCD Monitors, LCD Displays and Plasma Screens. Retrieved from www.vanptc.com, Sep. 22, 2008.

\* cited by examiner

DEVICE BRACKET WITH INTEGRATED DEVICE HUB

FIELD OF INVENTION

This disclosure relates to device brackets to physically and electrically interconnect devices, where the device bracket incorporates a device hub capable of controlling the function of those devices. This disclosure also relates to the automated configuration and/or operational control of devices determined, at least partially, by which coupling and/or electrical connector of a device hub they are coupled to.

BACKGROUND

Microphones, speakers, audio controls and other audio devices have been provided with numerous ways in which to be mounted in both residential and commercial settings over many years. As computers have recently acquired more advanced audio capabilities, and as home televisions employing only built-in speakers have recently been supplanted by home entertainment systems incorporating numerous distinct speakers (i.e., speakers that are physically separate from a display) to provide higher quality sound, ever more ways of mounting multimedia devices, especially audio devices, have been devised.

However, with the growing prevalence of flat panel displays in both computer systems and home entertainment systems, the opportunity to provide the visual display function in a thinner and less visually objectionable form has spurred on a desire to implement audio components in ways that are also less visually objectionable. As a result, more compact forms of speakers and other audio components are being created.

In this transition to thinner displays and more compact audio devices, finding ways to conceal the plethora of cables interconnecting these devices has now become a more prominent issue. Before this transition, the sheer size of tube-based and rear-projection televisions and computer displays tended to have the effect of relegating the unsightly nature of numerous cables draped between devices to being a largely insubstantial issue. Indeed, the bulkier cabinetry of these displays was often relied upon to conceal such cables. However, with this present day transition to thinner displays, there is now at least a perceived opportunity to "clean up" the overall appearance of computer and home entertainment installations, and a decreasing willingness to tolerate the unsightly and cluttered appearance of so many cables.

However, although ever greater attention has been given to the design of flat panel displays and compact speakers to increasingly mitigate their visual impact on a home or office interior, solutions for the routing and concealment of cables to achieve the same effect have been somewhat lacking. In particular, the installation of compact speakers and microphones alongside flat panel displays, including flat panel computer displays and flat panel televisions, continues to be accompanied by an unsightly tangle of cabling conveying both power and various audio/visual signals. This is expected to become ever more of an issue as the distinction between computer and entertainment functions becomes ever more blurred, and as still other devices incorporating both audio and visual functionality (e.g., video phone systems) begin to become commonplace. As such convergences of functionality take hold, the tangle of cabling accompanying such devices is only expected to become worse.

SUMMARY

An device bracket for mounting devices to a flat panel display incorporates a device hub able to form a network with devices coupled to it where the device hub associates one or more physical characteristics to devices coupled to it, including locality, orientation and position relative to the device hub. The device hub is conveys data indicating these physical characteristics associated with these devices to one or more of the devices coupled to it, thereby either enabling the devices with those physical characteristics to modify the manner in which they perform their own functions in response to those physical characteristics, or enabling other devices to modify data that they exchange with the devices having those physical characteristics in response to those physical characteristics.

In one aspect, a device bracket comprises a device hub to form a network to convey electrical signals among the device hub and at least a first device, wherein the device hub has a casing structured to be mounted to a flat panel display; a first coupling physically supported by the casing to enable the first device to be physically supported by the casing at a first position adjacent the flat panel display; and a first connector associated with the first coupling to electrically couple the first device to the device hub.

Implementations may include, and are not limited to, one or more of the following features. The casing of the device hub of the device bracket may comprise first and second faces, and a plurality of passages formed therebetween in a rectilinear pattern on the first and second faces to enable the device hub to be mounted to a flat panel display. The device bracket may additionally comprise one or more of additional couplings physically supported by the casing, additional connectors associated with those couplings, one or more arms cooperating with the casing to physically support one or more of the couplings, and an orientation sensor to determine the orientation of the casing relative to a gravitational pull. Where the device bracket comprises one or more arms, those arms may have movable portions enabling the first device to be moved relative to the casing of the device hub. The device hub may be structured to associate locality, orientation and/or position of the first device relative to a reference point of the casing with the first device, and may convey data indicating such locality, orientation and/or position to one or more devices coupled to the device hub. The device hub may be structured to employ a master-slave topology or a peer-to-peer topology in the network.

In another aspect, an arm comprises an elongate body having a first end and a second end, a first coupling at the first end to couple the arm to a casing of a device hub mountable to a flat panel display, a second coupling at the second end to couple the arm to a casing of a device to enable the arm to cooperate with the casing of the device hub to physically support the device at a position adjacent the flat panel display, a first connector associated with the first coupling to electrically couple the arm to the device hub, and a second connector associated with the second coupling to electrically couple the arm to the device, wherein the first and second connectors are electrically coupled to enable an electrical signal to be conveyed between the device hub and the device.

Implementations may include, and are not limited to, one or more of the following features. The arm may comprise movable portions enabling the second coupling to be moved relative to the first, and a position sensor to detect corresponding changes in position. The arm may further comprise a storage able to provide data regarding a characteristics of the position sensor.

In still another aspect, a device comprises a casing, a coupling disposed on the casing of the device to enable the device to be physically supported at a position adjacent a flat panel display by a casing of a device hub mounted to the flat panel display, and a connector associated with the coupling to enable the device to be electrically coupled to the device hub to enable an electrical signal to be conveyed between the device and the device hub.

Implementations may include, and are not limited to, one or more of the following features. The device may further comprise an arm to support the coupling, and the arm may comprise one or both of a movable portion enabling the coupling to be moved relative another portion of the device and a position sensor to detect the position of the movable portion relative to the other portion of the device. The device may further comprise one or more of a microphone, an acoustic driver, a camera and a manually-operable control.

Other features and advantages of the invention will be apparent from the description and claims that follow.

BRIEF DESCRIPTION OF THE DRAWINGS

FIG. 1b is a rear elevational view of the assembly of FIG. 1a.

FIG. 1c is a side elevational view of the assembly of FIG. 1a.

FIG. 1d is an exploded perspective view of the assembly of FIG. 1a.

FIGS. 4b and 4c are block diagrams of portions of the network of FIG. 4a.

DETAILED DESCRIPTION

It should be noted that although the following discussion employs terminology indicating direction and orientation, including words such as "left," "right," "top," "bottom," "above," "below," "front," "rear," "horizontal" and "vertical," such terminology is merely for clarity of description. Use of such terminology should not be construed as imposing limitations on coverage afforded by what is claimed herein.

Figure 1A:
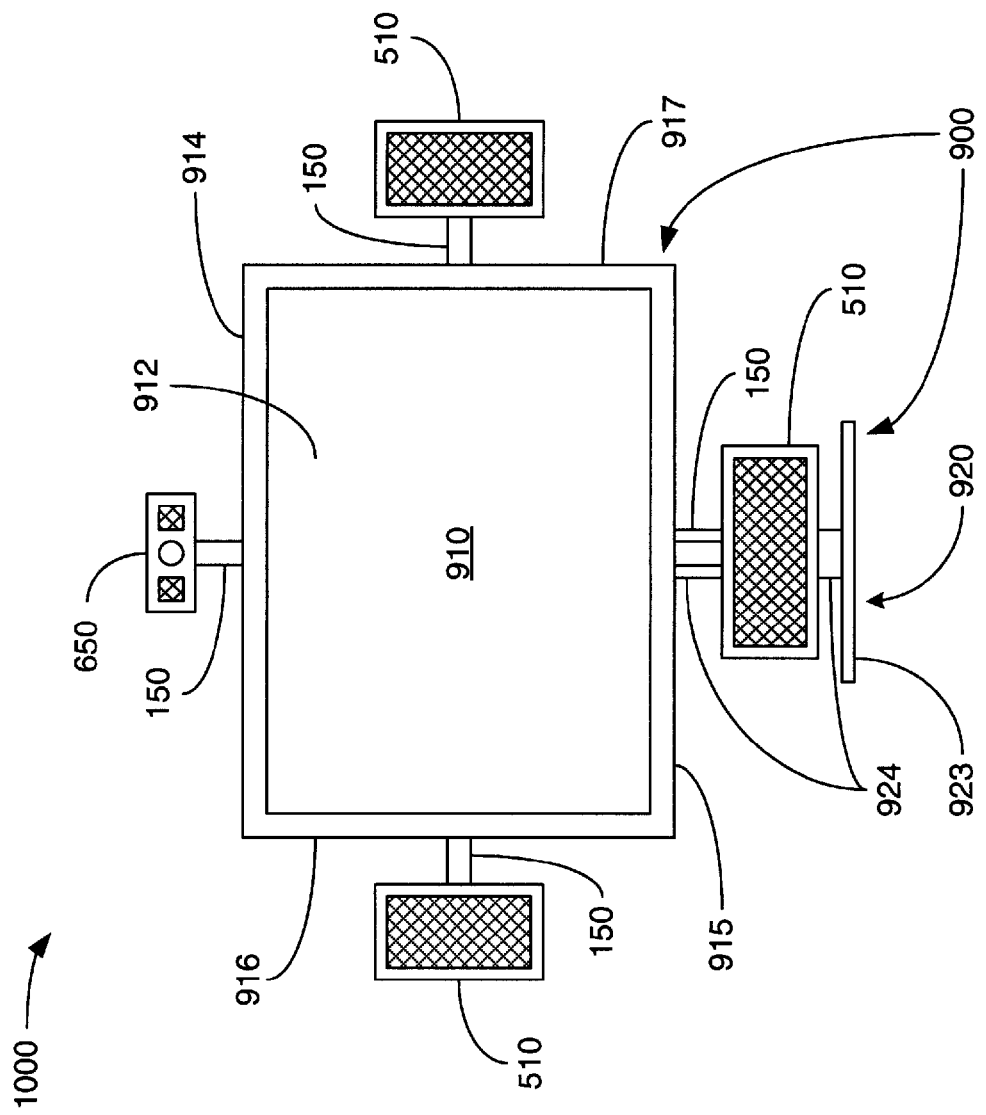
FIG. 1a is a front elevational view of an assembly.
Figure 1B:
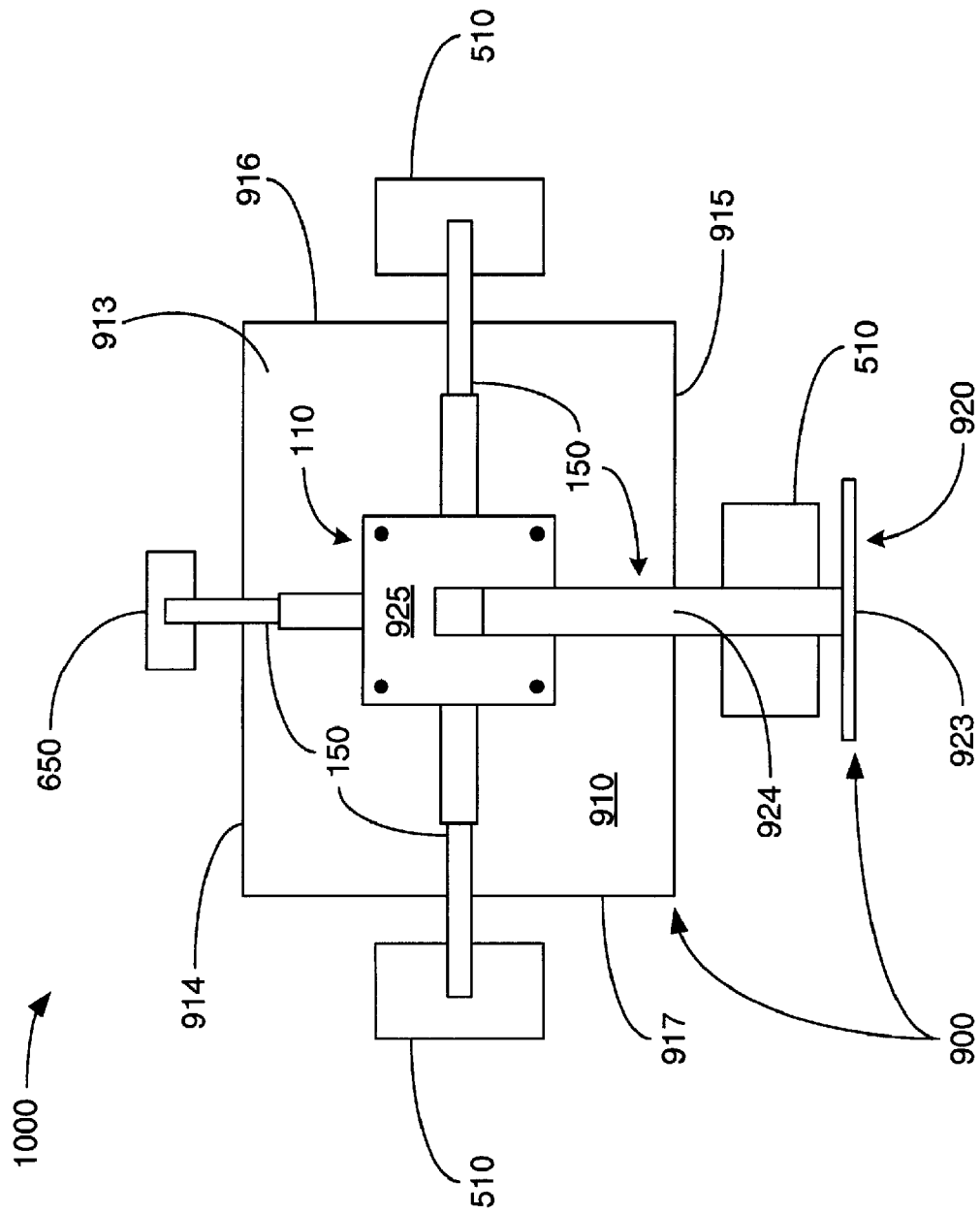
Figure 1C:
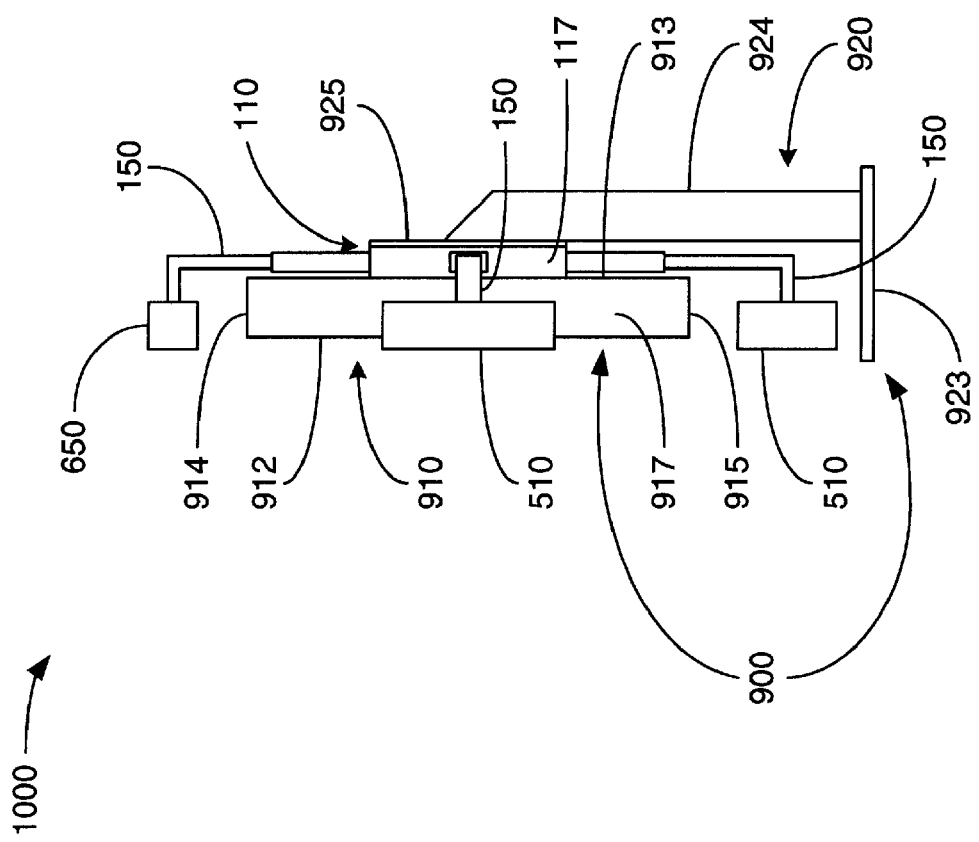
Figure 1D:
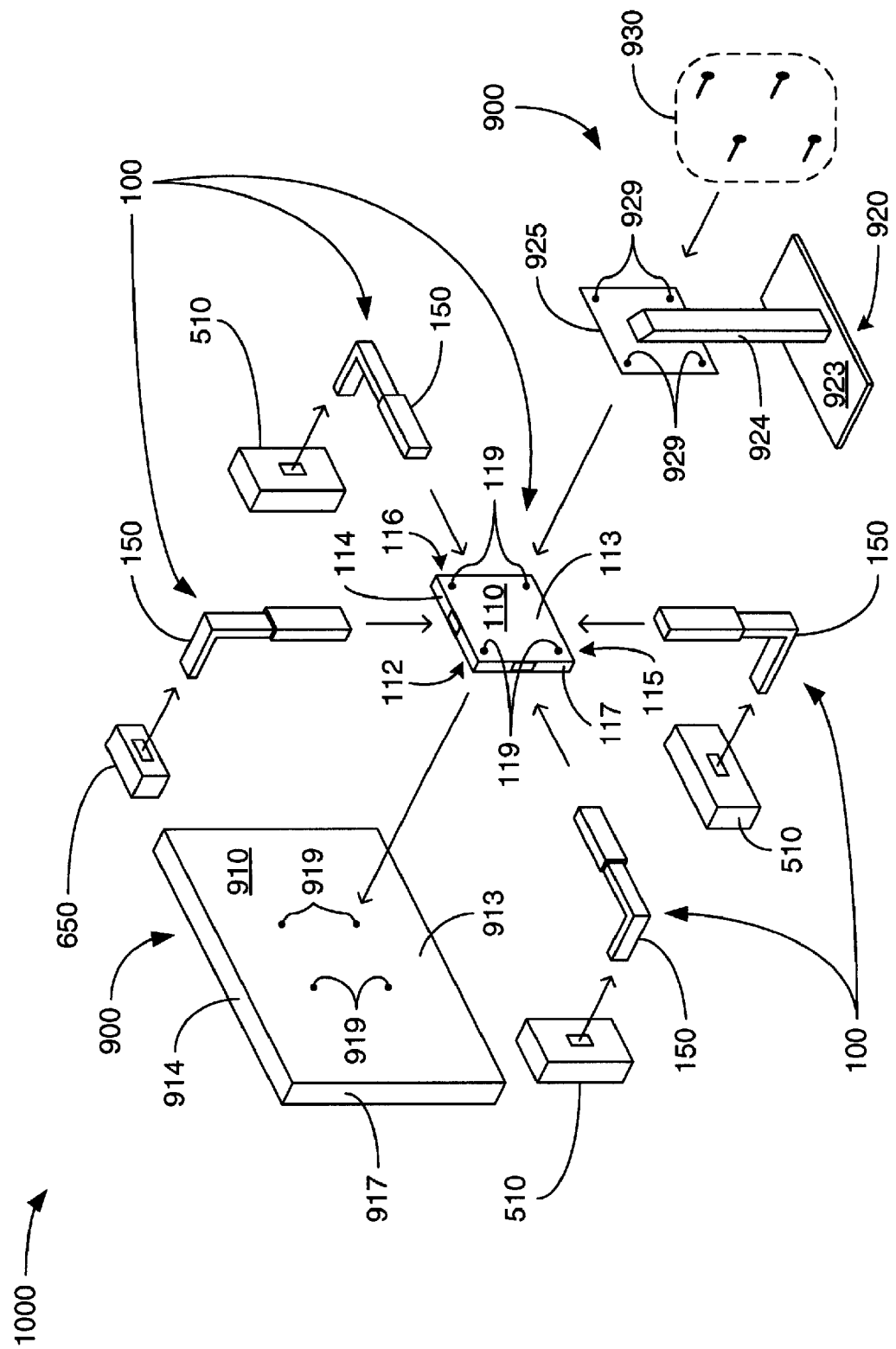

FIGS. 1a, 1b, 1c and 1d, taken together, depict an assembly 1000 of devices capable of performing various audio/visual or other multimedia functions. The assembly 1000 incorporates a form of a device bracket 100 to mount one or more devices, such as the device 650 and three of the devices 510, as depicted, to one form of a flat panel display 900. As will be explained, the device bracket 100 is mechanically attached to the flat panel display 900, and conveys electrical signals among one or more of the device 650, the three devices 510, and a cable emanating from a remote device (not shown, but which will later be depicted and discussed in greater detail) while mitigating the visual impact of the manner in which these signals are conveyed and enabling enhanced interoperability between these devices. FIGS. 1a-c are front, rear and side elevational views of the assembly 1000 in fully assembled form, and FIG. 1d is an exploded perspective view depicting the manner in which portions of the device bracket 100 and the flat panel display 900 are coupled to form the assembly 1000.

The flat panel display 900 may be any of a variety of types of flat panel display serving any of a variety of purposes. By way of example only, the flat panel display 900 may be based on liquid crystal display (LCD) technology, and may be employed as a display for a computer system (not shown), at least a component of which is the remote device. Also by way of example only, the flat panel display 900 may be based on plasma display technology, and may be employed as a television display for a home entertainment system (not shown), at least a component of which is the remote device. As is best seen in FIGS. 1c and 1d, the flat panel display 900 incorporates a panel 910, a support 920 and mounting hardware 930 commonly employed to attach the panel 910 directly to the support 920. The panel 910 has a front face 912, a rear face 913, a top edge 914, a bottom edge 915, a left edge 916 and a right edge 917. The depicted form of the support 920 incorporates a base plate 923, an arm 924 and a mounting plate 925, although those skilled in the art will readily recognize that the support 920 may take any of a variety of other physical forms. As will be explained in greater detail, the mounting hardware 930 is commonly a set of four machine screws that extend through a set of passages 929 formed through the mounting plate 925 and into an aligned set of mounting holes 919 formed in the rear face 913 of the panel 910. As will also be explained in greater detail, the mounting holes 919 are commonly threaded to be engaged by machine screw threads of the mounting hardware 930. In this way, the mounting plate 925 of the support 920 may be directly coupled to the rear face 913 of the panel 910 where the device bracket 100 is not coupled to the flat panel display 900. However, in the assembly 1000, the mounting hardware 930 is further employed to mount the device bracket 100 to the flat panel 900, as will be explained in greater detail.

The device 650 and each of the three devices 510 may be any of a variety of types of device serving any of a variety of purposes. However, for the sake of brevity and understanding of the embodiments herein, specific functions are attributed to each of the device 650 and the three devices 510 in this discussion of the assembly 1000. Specifically, the device 650 is a camera incorporating a microphone, and one each of the three devices 510 are left, right and center channel speakers. Together, the flat panel display 900, the device bracket 100, and the devices 510 and 650 of the assembly 1000 enable various combined functions. In one variant of the assembly 1000 into which the device 650 is not incorporated, one possible such function is that of an audio/visual playback system provided with audio/visual data from a remote device such as video playing device or a computer system. In another variant of the assembly 1000 into which all of the devices 510 and 650 are incorporated, another possible such function is that of an audio/visual two-way communications system (e.g., a "video telephone") in which audio and video is exchanged between the assembly 1000 and a remote device such as a modem providing an interface to a telephone line.

In the assembly 1000, the device bracket 100 is meant to be mounted between the support 920 and the panel 910. The device bracket 100 incorporates a device hub 110, and one or more arms 150 to both physically and electrically couple one or more of the devices 510 and 650 to the device hub 110. The device hub 110 has a front face 112, a rear face 113, a top edge 114, a bottom edge 115, a left edge 116 and a right edge 117. The device hub 110 is preferably mounted in a manner in which the hub is "sandwiched" between the mounting plate 925 of the support 920 and the rear face 913 of the panel 910. When so mounted, the front face 112 of the device hub 110 faces (and is preferably in contact with) the rear face 913 of the panel, and the rear face 113 of the device hub 110 faces (and is preferably in contact with) the mounting plate 925 of the support 920. The device hub 110 has a plurality of passages 119 formed therethrough and extending between the front face 112 and the rear face 113. At least some of the passages 119 are positioned on the front face 112 and rear face 113 to align with at least some of the holes 919 of the panel 910 and the passages 929 of the support 920 when the device hub 110 is mounted so as to be sandwiched therebetween. These passages 119 have dimensions chosen to allow the mounting hardware 930 to pass therethrough to secure the device hub 110 in place between the mounting plate 925 and the rear face 913.

Each of the arms 150 conveys electrical signals between a connector disposed on the casing of the device hub 110 and a corresponding connector disposed on the casing of an associated one of the three devices 510 and the device 650. As will be discussed, each of the arms 150 may take any of a variety of physical forms, including straight arms, curved arms, and arms having one or more fixed or flexible elbows. The particular form of the arms 150 depicted in FIGS. 1a-d is a form having a fixed elbow that is bent to enable reaching around the panel 910 from the vicinity of the rear face 913 of the panel 910 to the vicinity of one of the edges 914, 915, 916 and 917 of the panel 910. In this way, each of the arms 150 may be coupled to a rearwardly facing connector carried by corresponding ones of the three devices 510 and the device 650 to physically support each of these devices in a manner in which they appear to be "suspended" in place alongside corresponding ones of the edges 914, 915, 916 and 917 of the panel 910 from the perspective of someone viewing the front face 912 of the panel 910. Further, by conveying electrical signals between the device hub 110 and each of these devices, the arms 150 (regardless of whatever form they take) remove the need for unsightly cables to be connected directly to any of these devices. This has the visual effect of leaving the arms 150 as the only physical objects to actually make physical contact with each of the three devices 510 and the device 650, thereby providing an uncluttered and more pleasant appearance not usually associated with efforts to combine various devices to create an assembly such as the assembly 1000.

Figure 2A:
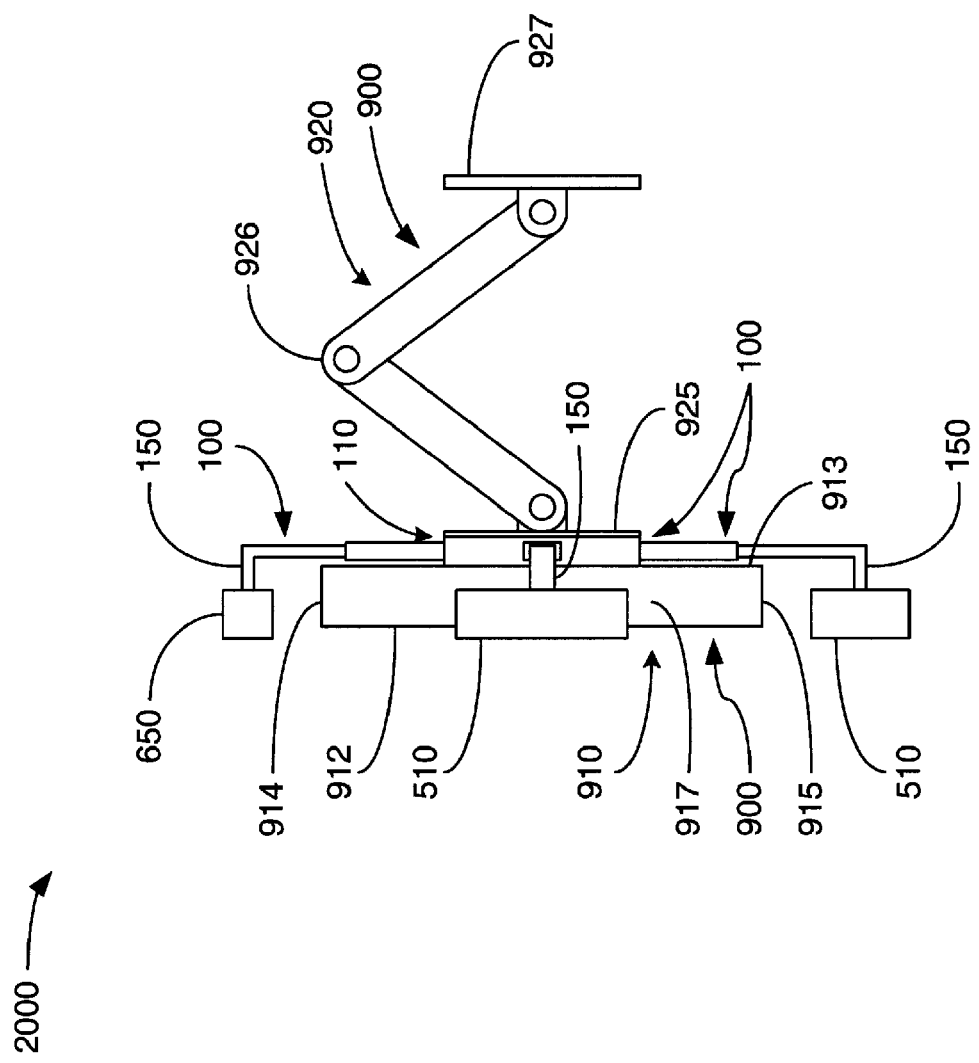
FIG. 2a is a side elevational view of another assembly.

FIG. 2a depicts another assembly 2000 of devices. Not unlike the assembly 1000 of FIGS. 1a-d, the assembly 2000 also incorporates the device bracket 100 to mount one or more of the device 650 and each of the three devices 510 to a form of flat panel display 900. Much of what is depicted of the assembly 2000 in FIG. 2a is substantially similar to what is depicted of the assembly 1000 in FIGS. 1a-d, and therefore, corresponding items have been given identical numerical labels. However, a significant difference between the assemblies 1000 and 2000 is that while the support 920 of the assembly 1000 is describable as being a stand more conducive to supporting the panel 910 atop a horizontal flat surface (e.g., a desk or a table), the support 920 of the assembly 2000 is describable as being a flexible arm more conducive to affixing the panel 910 to a vertical surface (e.g., a wall). The support 920 of the assembly 2000 incorporates a mounting plate 925 that may be substantially similar to the mounting plate 925 of the assembly 1000, a flexible arm 926 incorporating one or more hinges, and another mounting plate 927. In another possible variation of the assembly 2000, the flexible arm 926 may be replaced with either a shorter arm that incorporates no hinges or a detachable link (not shown) between the mounting plates 925 and 927.

Figure 2B:
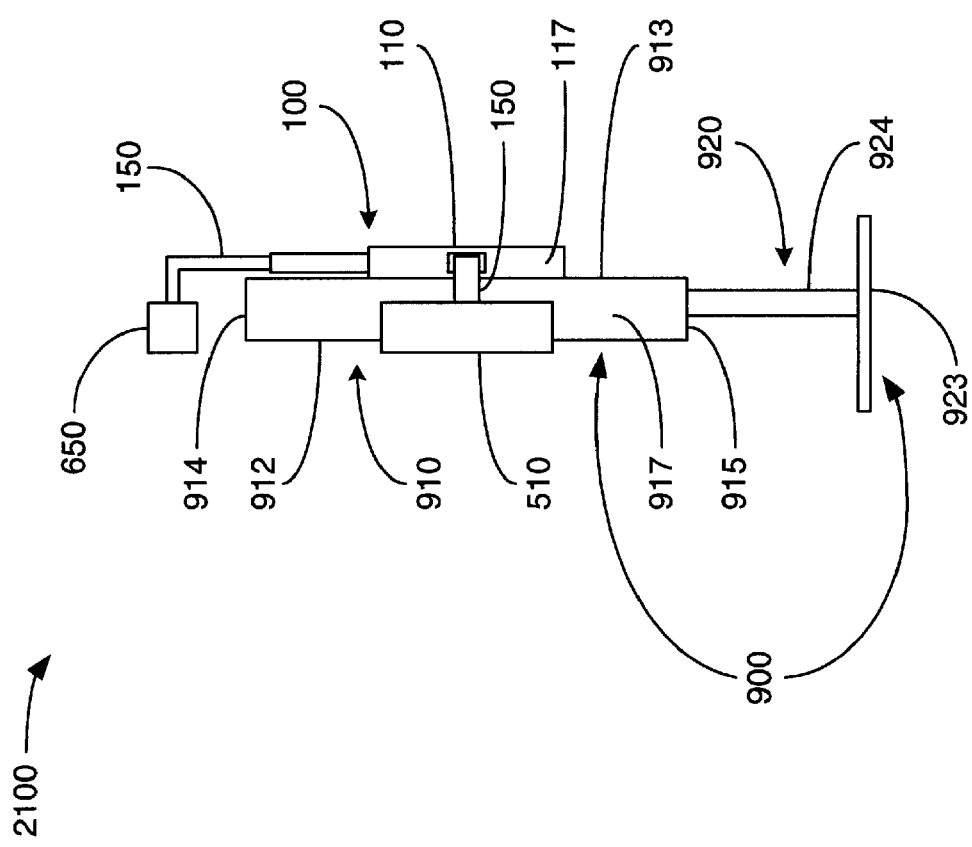
FIG. 2b is a side elevational view of still another assembly.

FIG. 2b depicts still another assembly 2100 of devices. Somewhat like the assembly 1000 of FIGS. 1a-d and the assembly 2000 of FIG. 2a, the assembly 2100 also incorporates the device bracket 100 to mount one or more devices. Again, much of what is depicted of the assembly 2100 in FIG. 2b is substantially similar to what is depicted of the assembly 1000 in FIGS. 1a-d and assembly 2000 in FIG. 2a, and again, corresponding items have been given identical numerical labels. However, a significant difference between the assembly 2100 and both of the assemblies 1000 and 2000 is that while the support 920 of the assemblies 1000 and 2000 is coupled to the panel 910 through a coupling of corresponding forms of the mounting plate 925 to the rear face 913 with the device hub 110 interposed therebetween, the support 920 of the assembly 2100 is coupled to the panel 910 at a point on or adjacent to the bottom edge 915 with the device hub 110 being separately coupled to the rear face 913 of the panel. Those skilled in the art will readily recognize this manner of coupling the panel 910 and this alternate form of the support 920 as being a commonplace alternative to the commonplace direct coupling of the panel 910 and the support 920 at the rear face 913 of the panel 910. They will also recognize that it is also commonplace in such an alternate variant of the flat panel display 900 to still incorporate the mounting holes 919 in the rear face 913 to accommodate users who choose to remove the support 920 of this alternate variant in favor of using a different support in which the mounting holes 919 are utilized. However, the assembly 2100 is depicted herein to make clear that the device hub 110 may still be mounted to the rear face 913 of the panel 910 in such an alternate variant without being sandwiched between the panel 910 and any form of support. Instead, the mounting hardware 930 may be used solely to mount the device hub 110 to the rear face 913 of the panel 910.

Figure 3A:
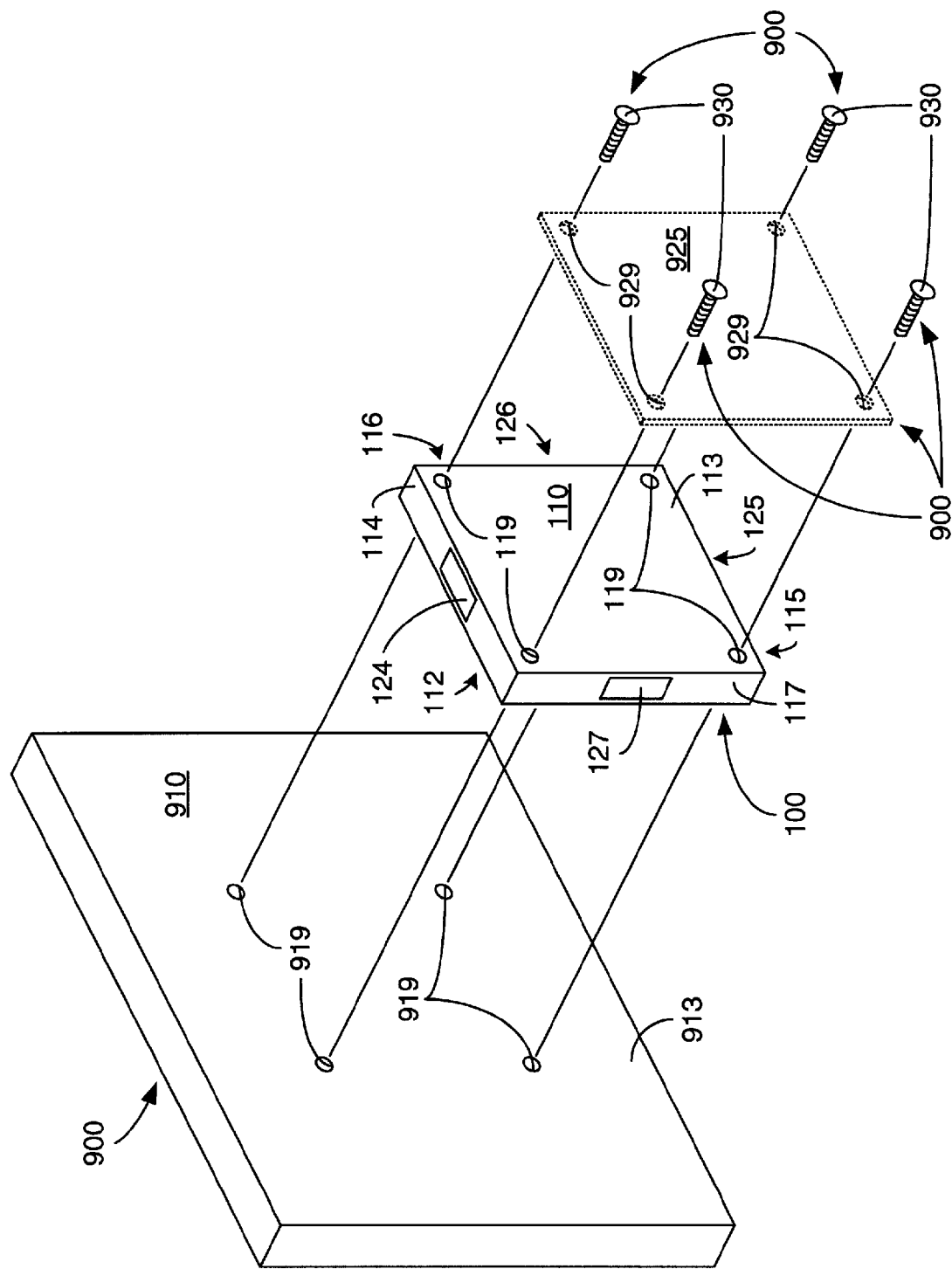
FIGS. 3a, 3b, 3c and 3d are exploded perspective views of portions of an assembly.
Figure 3B:
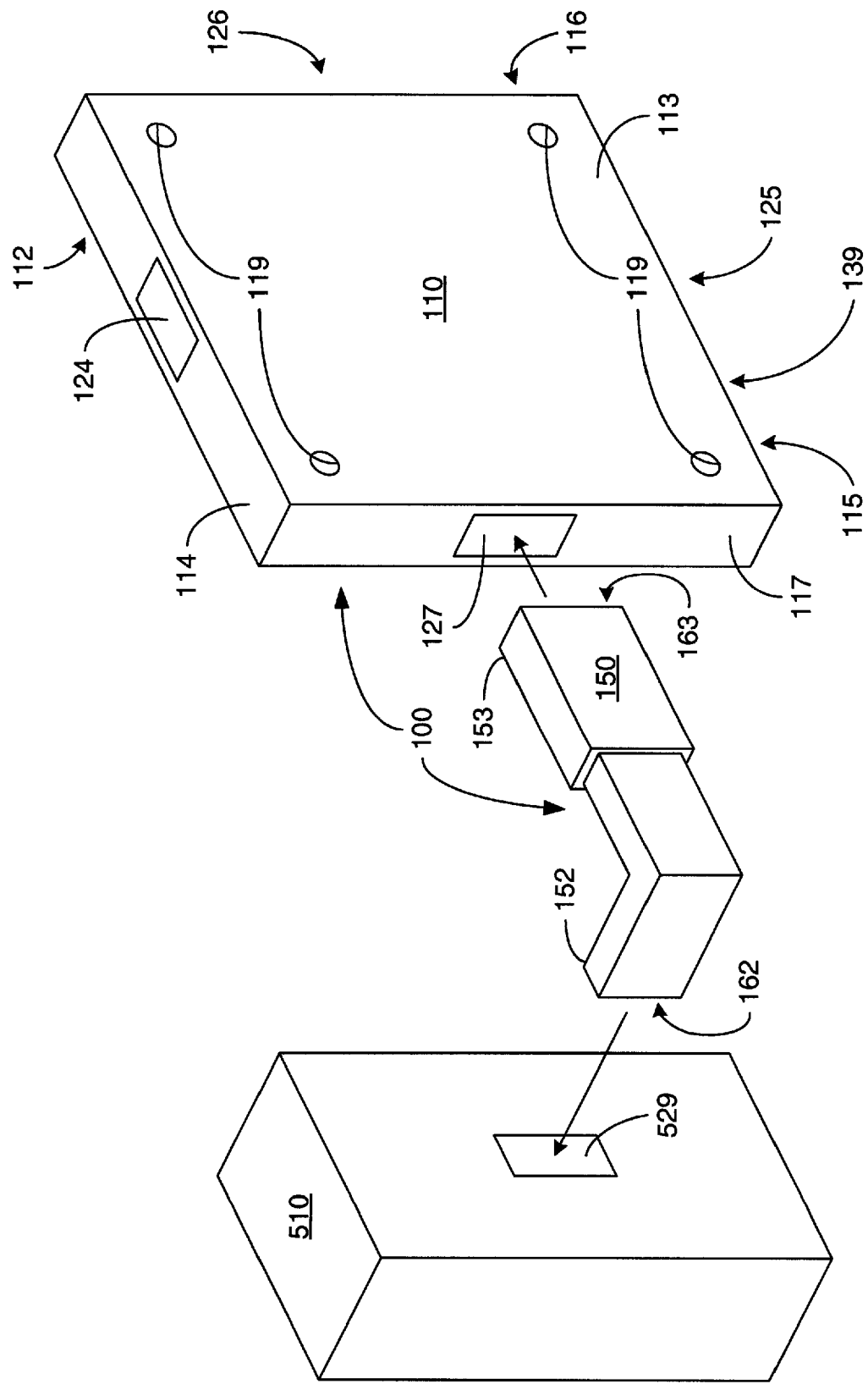
Figure 3C:
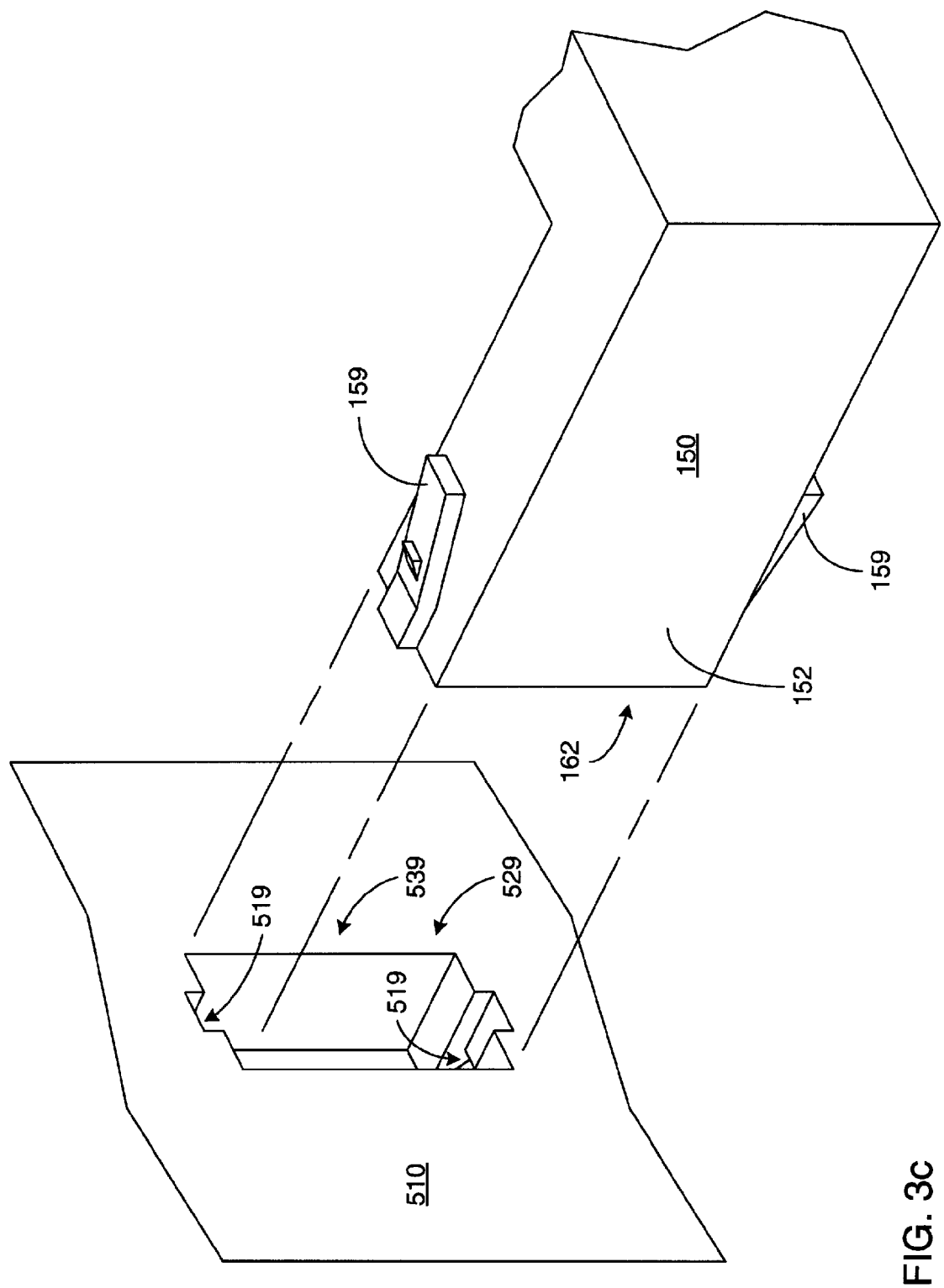
Figure 3D:
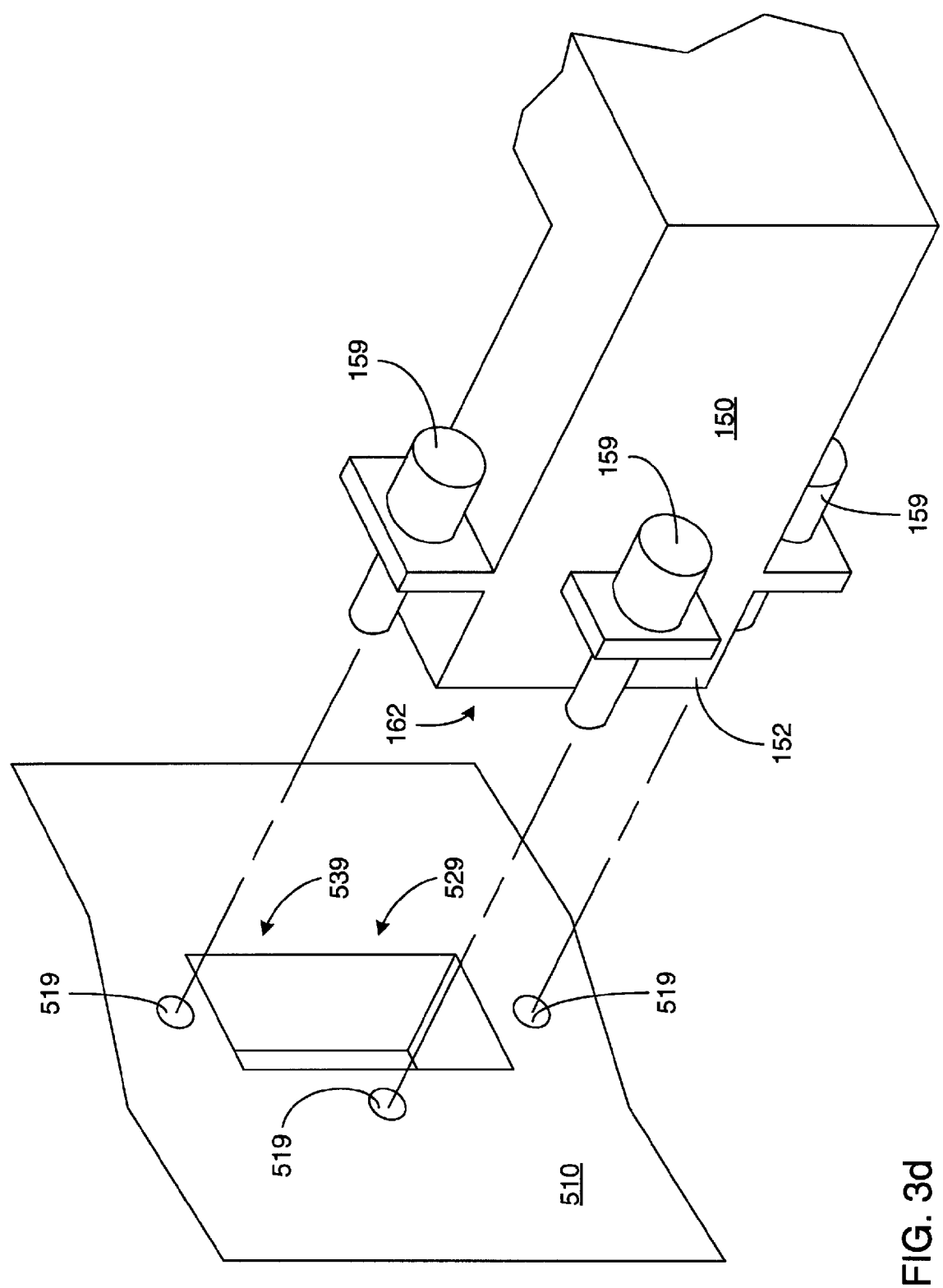

FIGS. 3a, 3b, 3c, and 3d, taken together, more clearly depict the manner in which the device hub 110 is shaped to support being mounted between the panel 910 and the mounting plate 925, and the manner in which devices are both physically and electrically coupled to the device hub 110 via the arms 150. FIG. 3a more clearly depicts the manner in which the holes 919 of the panel 910, the passages 119 of the device hub 110 and the passages 929 of the mounting plate 925 are able to be aligned to allow the mounting hardware 930 to both pass through the passages 929 and 119 and enter the holes 919 to mount the device hub 110 in a sandwiched configuration between the panel 910 and the mounting plate 925. FIG. 3b more clearly depicts the physical and electrical coupling of a device to the device hub 110 (with one of the devices 510 being selected to serve as the depicted example). FIGS. 3c and 3d are perspective views depicting possible forms of mechanical attachment to captively couple an end of one of the arms 150 to the device hub 110 and/or the example device 510.

Turning to FIG. 3a, as previously discussed, a plurality of passages 119 are formed through the casing of the device hub 110 for use in mounting the device hub 110 to the flat panel display 900 by mounting the device hub 110 between the panel 910 and one form of the support 920, as earlier discussed and depicted for the assemblies 1000 and 2000, or by mounting the device hub 110 to the panel 910 while another form of the support 920 is coupled elsewhere to the panel 910, as earlier discussed and depicted for the assembly 2100. Four of the passages 119 by which the device hub 110 is mounted are positioned to form a rectangular pattern with each of four passages 119 positioned at a corner of that rectangle. As will be familiar to those skilled in the art, an industry standards organization known as the Video Electronics Standards Association (VESA®) of Milpitas, Calif., promulgates the Flat Display Mounting Interface Standard (FDMI™) which specifies a set of mechanical mounting configurations for use with flat panel displays. Early incarnations of this standard were meant to enhance manufacturing efficiencies for those producing supports for flat panel displays for computer systems, and have become widely adopted by producers of these flat panel displays. However, over time, both early and more recent incarnations of this standard have also been widely adopted by producers of flat panel displays for home entertainment systems, as well as for other industries in which flat panel displays have been employed.

Of significance to the design of the device bracket 100 are the specifications for mounting holes, their dimensions, and mounting hardware called for in the FDMI standard. For flat panel displays of 12" to 22.9" in diagonal measure and weighing up to 14 kg, an arrangement of four mounting holes in either a 75 mm×75 mm or a 100 mm×100 mm square pattern is specified to be provided on a rear face of the casing of the panels of such displays in which the holes are threaded to receive 4 mm diameter machine screws. For flat panel displays of 23" to 30.9" in diagonal measure and weighing up to 23.7 kg, an arrangement of six mounting holes in a 100 mm×200 mm rectangular pattern is specified to be provided on a rear face of the casing of panels of such displays in which the holes are again threaded to receive 4 mm diameter machine screws. Numerous other hole patterns and other mounting details for other sizes and weights of flat panel displays in various differing situations are also provided for in the FDMI standard, but are not detailed herein for the sake of brevity of discussion.

Those involved in authoring the various incarnations of this standard were aware that producers of supports for flat panel displays were likely to match the weight bearing capabilities of their supports to the size and configuration of the different hole patterns called for in the FDMI standard. In other words, flat panel displays having the 75 mm×75 mm or 100 mm×100 mm square hole mounting patterns would be presumed to be lighter than flat panel displays having the 100 mm×200 mm rectangular hole mounting pattern, and producers of supports would therefore design joints and other components of their supports in reliance on this presumption. Similarly, flat panel displays having the 100 mm×200 mm rectangular hole mounting pattern would be presumed to be lighter than flat panel displays having one of the larger rectangular hole mounting patterns employing 6 mm or 8 mm machine screws called for in the FDMI standard. However, those skilled in the art will readily recognize that despite these efforts made to rigidly specify which hole patterns are to be used with which sizes and weights of flat panel displays, there has been some tendency to make use of particular ones of the FDMI hole mounting patterns across a greater range of display sizes and weights than are strictly called for in the FDMI standard. By way of example, the 100 mm×100 mm square hole pattern of four holes, which has over time become one of the most widely used, has been frequently employed even with displays up to 30" in diagonal measure and greater than 14 kg in weight.

In recognition of the above factors, the shape, size and configuration of at least one form of the device hub 110 are preferably selected such that the passages 119 are arranged in a pattern matching the 100 mm×100 mm square hole pattern specified by the FDMI standard for 12" to 22.9" diagonal measure displays to accommodate this very widely used hole pattern. Alternatively, the shape, size and configuration of at least one other form of the device hub 110 are preferably selected such that the passages 119 are arranged in a pattern matching a 100 mm×200 mm rectangular hole pattern useable with larger displays. Also, in recognition of the above factors, the thickness of the casing of the device hub 110 (i.e., the distance between the front face 112 and the rear face 113) is minimized to provide little more than the space needed to accommodate the attachment of the arms 150 to the device hub 110 in order to minimize the additional torque exerted on the support 920 by the weight of the panel 910 as a result of the rear face 913 of the panel 910 being mounted forward and away from the mounting plate 925 of the support 920 as a result of the device hub 110 being mounted therebetween.

It should be reiterated that FIG. 3a reflects the manner in which the device hub 110 is mounted in each of the assemblies 1000 and 2000 in which the support 920 employs the mounting plate 925 to couple the support 920 to the rear face 913 of the panel 910. Therefore, it should also be reiterated that the device hub 110 may be mounted to the rear face 913 of the panel 910 in the manner earlier depicted and described with regard to the assembly 2100 in which a different form of the support 920 is coupled to the panel 910 at or near the bottom edge 915, and there is no mounting plate 925 such that the device hub 110 is coupled to the rear face 913 solely with the mounting hardware 930. It is in recognition of this alternative manner in which the device hub 110 may be mounted that the mounting plate 925 is depicted with dotted lines.

FIG. 3b more closely depicts the manner in which one of the arms 150 couples the example device 510 to the device hub 110 to both physically support the example device 510 and to electrically couple the example device 510 to the device hub 110. Specifically, a coupling 163 carried by one end 153 of the arm 150 is mated to a coupling 127 disposed on the right edge 117 of the device hub 110, and similarly, a coupling 529 disposed on a face of the casing of device 510 is mated to a coupling 162 carried on another end 152 of the arm 150. The depicted form of the device hub 110 has four couplings 124, 125, 126 and 127 disposed on the edges 114, 115, 116 and 117, respectively, enabling a quantity of up to four of the arms 150 to be coupled to the device hub 110. The depicted form of the device hub 110 also has a cable connector 139 (not visible) disposed on the bottom edge 115 enabling the device hub 110 to be coupled to a remote device by a cable, as will be discussed in greater detail. However, it should be noted that other forms of the device hub 110 may have more or fewer cable connectors and/or couplings disposed about various edges or other portions of the casing of the device hub 110 enabling differing quantities of cables and the arms 150 to be thereby coupled to those forms of the device hub 110. As previously discussed, each of the arms 150 are meant to cooperate with the device hub 110 both to physically support various devices coupled to the device hub 110 through one or more of the arms 150, and to electrically couple those devices to the device hub 110. To do this, each of the couplings 124, 125, 126, 127, 162, 163 and 529 incorporates some manner of mechanical hardware to enable a captive physical connection, and each of these couplings incorporates an electrical connector to enable the conveyance of electrical signals.

FIGS. 3c and 3d each depict a different form of mechanical hardware to hold the coupling 162 into engagement with the coupling 529 to effect such a captive physical connection that will be readily familiar to those skilled in the art. Specifically, FIG. 3c depicts the use of one or more manually-operable living hinge release tabs 159 that engage capture notches 519 in one form of the example device 510, and FIG. 3d depicts the use of one or more manually-operable thumbscrews 159 that engage threaded holes 519 in another form of the example device 510.

Figure 4A:
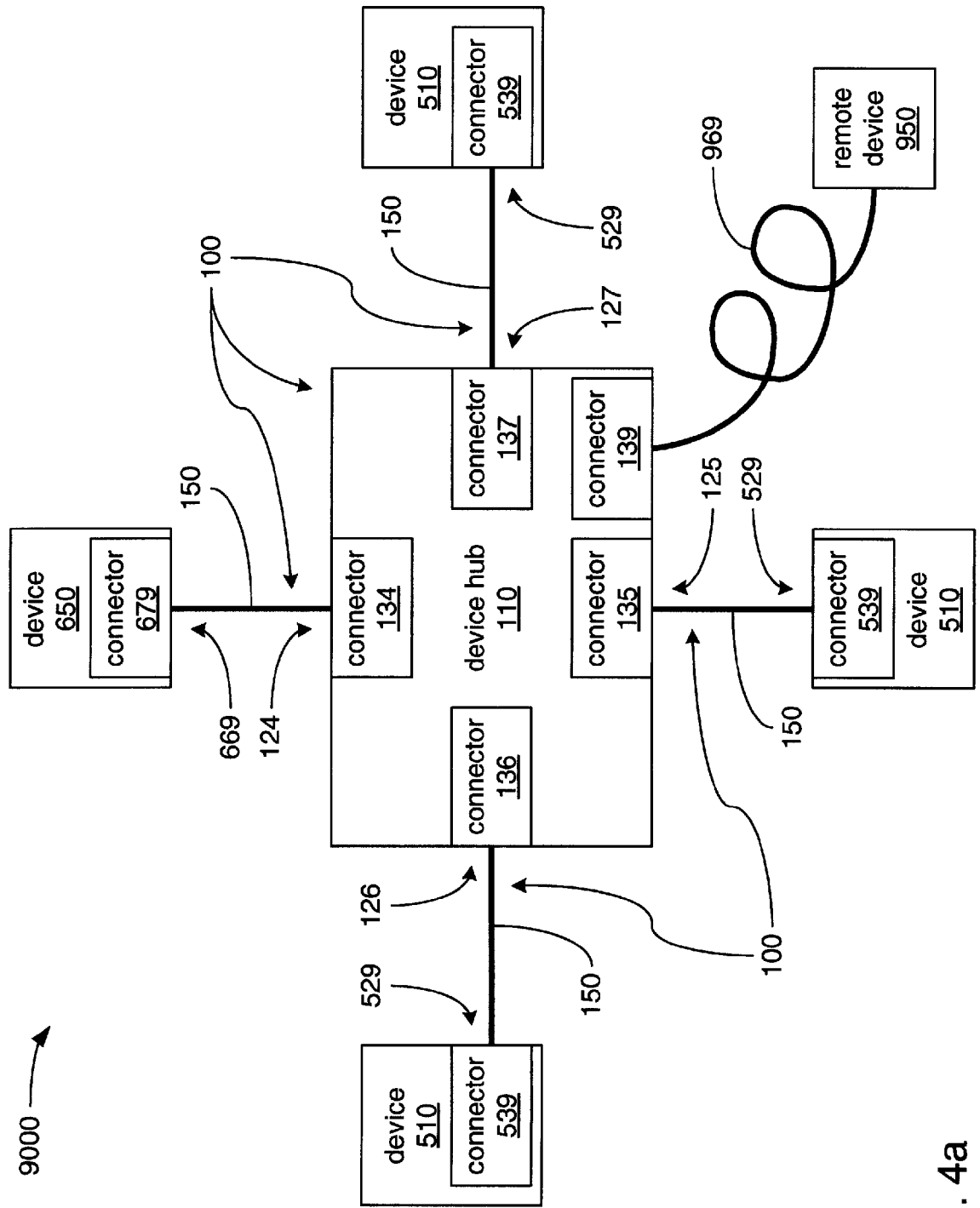
FIG. 4a is a block diagram of interconnection of a network associated with an assembly.
Figure 4B:
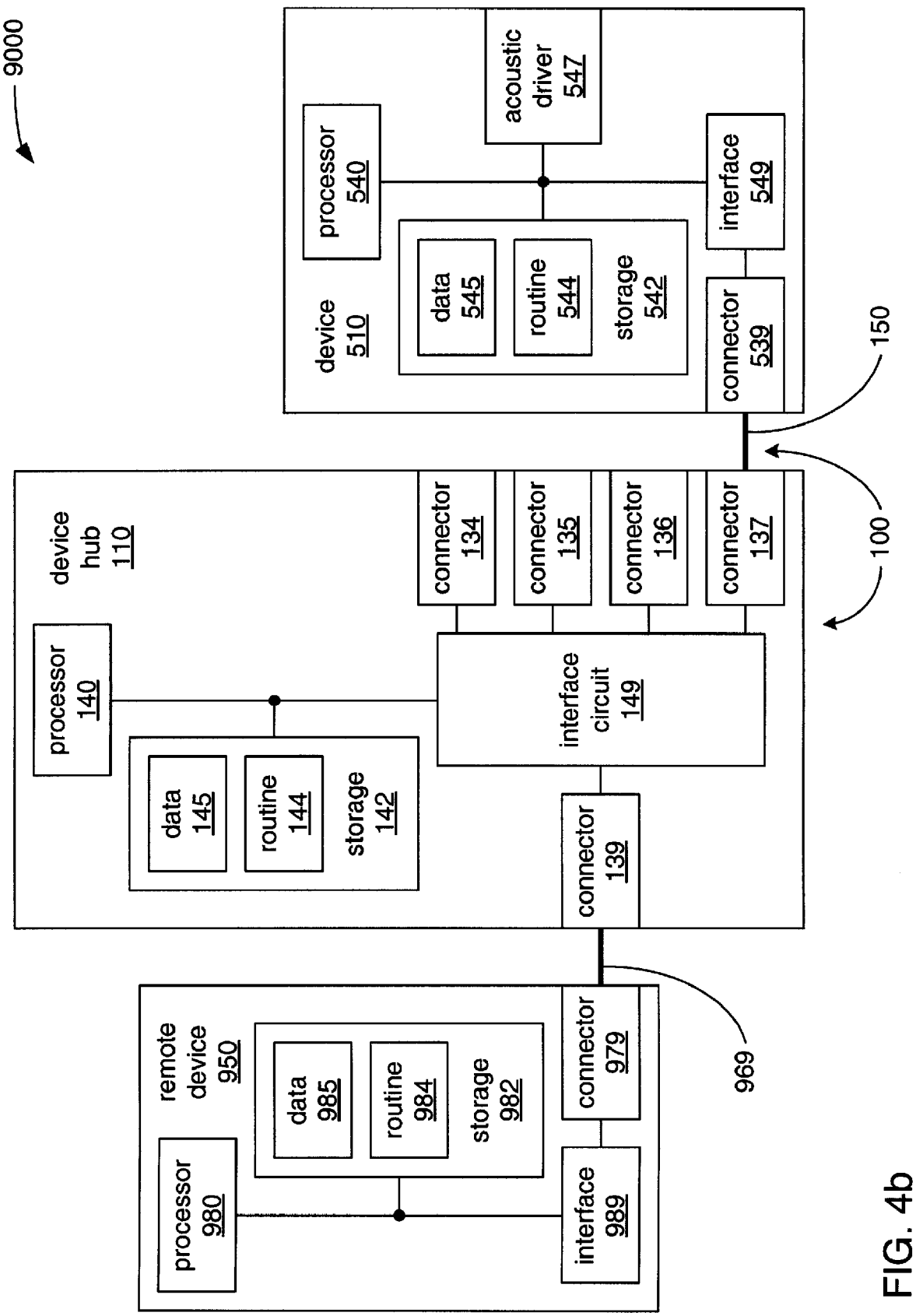
Figure 4C:
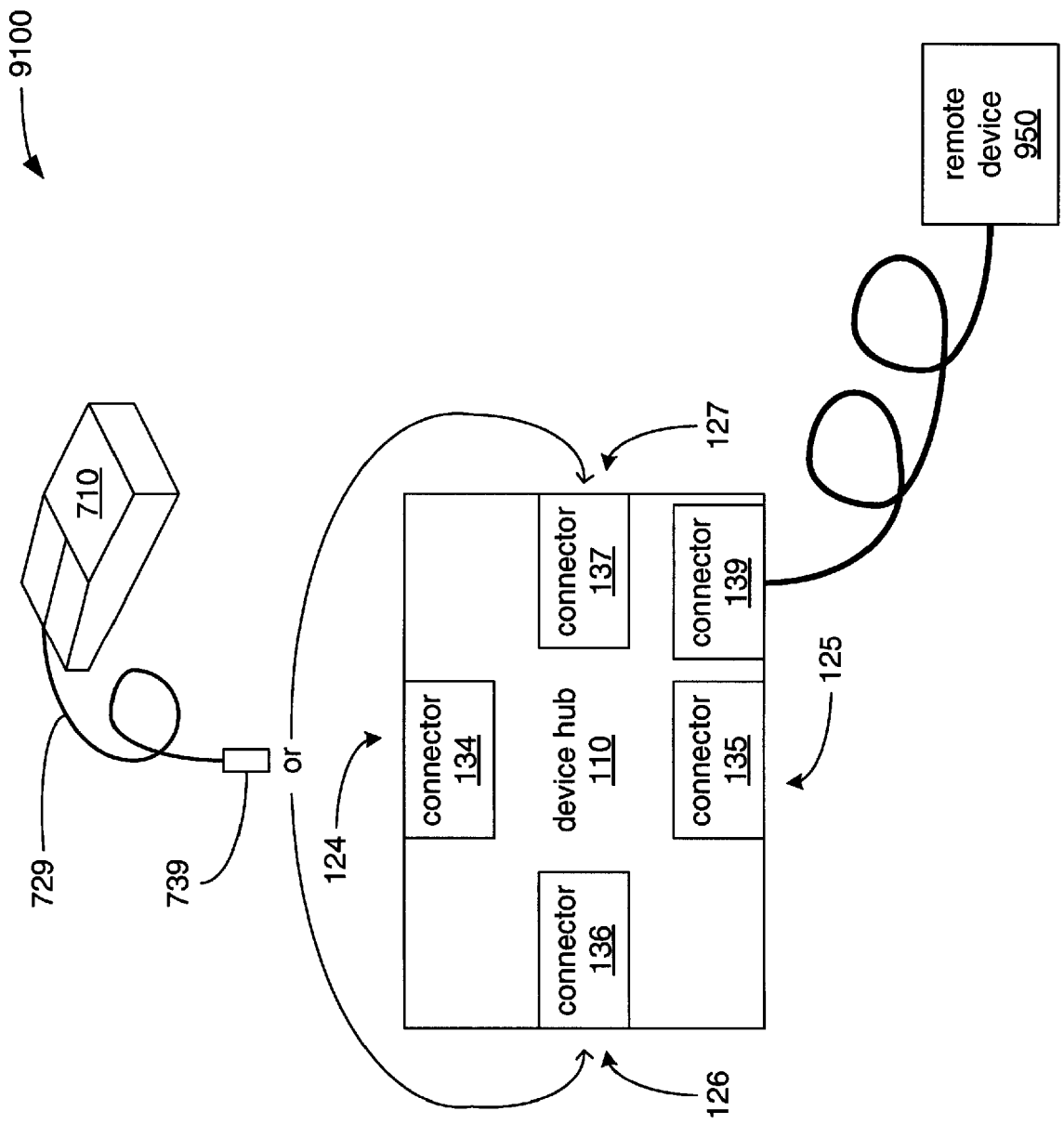

FIGS. 4a, 4b and 4c, taken together, depict networks or portions of networks incorporating devices that make up such assemblies as the aforedescribed assemblies 1000, 2000 and 2100. FIG. 4a is a block diagram providing an overview of the interconnection of devices making up a network 9000, which roughly corresponds to the interconnection of devices making up both of the assemblies 1000 and 2000. FIG. 4b is a block diagram providing a more detailed view of a portion of the interconnections of the network 9000. Not unlike FIGS. 3a-d providing more detailed views of a portion of an assembly, in FIG. 4b, one of the devices 510 is employed as an example in depicting the electrical coupling of a device to the device hub 110. FIG. 4c is a block diagram depicting at least a portion of an alternate network 9100 in which there is a coupling between the device hub 110 and a corded device, as opposed to a device coupled to the device hub 110 via one of the arms 150.

Turning to FIG. 4a, the electrical connections making up the network 9000 give the network 9000 a "star" or "hub and spoke" physical topology with the device hub 110 at the hub position, and each one of the remote device 950, the device 650 and the three devices 510 occupying one of the spoke positions. As previously discussed with regard to FIGS. 3a-d, each of the couplings of the device hub 110, the device 650 and the three devices 510 incorporate a connector that is engaged by a corresponding connector on one or the other of the couplings 162 and 163 of the arms 150 to electrically couple the device hub 110 to each of these devices. The couplings 124, 125, 126 and 127 of the device hub 110 incorporate connectors 134, 135, 136 and 137, respectively. Similarly, the coupling 529 of each one of the devices 510 incorporates a connector 539. The connectors 135, 136 and 137 of the device hub 110 are each electrically coupled to the connector 539 of a corresponding one of the devices 510 through a corresponding one of the arms 150. Also, the device 650 has a coupling 669 disposed on its casing that incorporates a connector 679, and the connectors 134 and 679 are electrically coupled through another one of the arms 150. Further, the connector 139 of the device hub 110 is electrically coupled to a cable 969 of the remote device 950 to thereby electrically couple the remote device 950 to the device hub 110.

Although the network 9000 may have a star physical topology, those skilled in the art will readily recognize that depending on the electrical signaling, protocols and/or initialization procedures employed within the network 9000, the manner in which communication between devices is coordinated within the network 9000 could take on any of a number of configurations, including and not limited to, a peer-to-peer configuration or a master-slave configuration. More specifically, in some embodiments, the remote device 950 and each of the device 650 and the three devices 510 are peers having equal abilities and priority relative to each other in conveying commands and/or data from one to another. Also more specifically, in some other embodiments, the remote device 950, the device 650 or one of the three devices 510 is a master or upstream device relative to the other devices, and would have the ability to at least control the conveying of commands and/or data between devices, thereby relegating the others of these devices to being slave or downstream devices relative to the master or upstream device.

The choice between peer-to-peer, master-slave or some other configuration can dictate the manner in which communications between devices in most networks are enabled. More to the point, some degree of initialization within most networks must take place to enable a command or a piece of data to be conveyed from one device to another device. The one device must either autonomously locate the other device on a given network, or the one device must be provided with information regarding how to contact the other device on that network. In a peer-to-peer configuration, it is commonplace for each device on a network to seek out another particular device to enable communications using data that has been previously provided to each device to enable it locate the other, and it is commonplace for no one device in a peer-to-peer configuration to be aware of the presence of all of the others. In a peer-to-peer configuration, all devices are allowed to independently initiate and carry out communications with any of the other devices. In a master-slave configuration, it is commonplace for a master device to perform all the work of locating the other devices that are downstream of the master device (such that those other devices are slave devices from the perspective of the master) so that the master device is aware of the presence of all of the slave devices and is able to communicate with each of the slave devices. In a master-slave configuration, it is commonplace for the master device to directly relay all communications between slave devices in response to requests from those slave devices to do so, and for no slave device to ever directly communicate with another slave devices through the network. Despite this in depth discussion of these two configurations, however, it should be reiterated, and those skilled in the art will readily recognize, that other configurations of network communication are possible, including configurations employing various possible hybrids of the peer-to-peer and master-slave configurations.

As previously stated, the electrical signaling, protocols and/or initialization procedures employed within the network 9000 may dictate the manner in which communications are coordinated. In turn, the electrical signaling, protocols and/or initialization procedures, themselves, may be dictated by a choice of communications standards selected from any of a variety of currently available or future variants of currently available communications standards. Among such possible standards are the Universal Serial Bus (USB) promulgated by the USB Implementer's Forum, Inc., of Beaverton, Oreg., and one of the variety of forms of Ethernet promulgated by the Institute of Electrical and Electronics Engineers, Inc. (IEEE®) of Piscataway, N.J., in at least the IEEE 802 series of standards. The USB standard was created with the intention of supporting communications between multiple peripheral devices and a single "host" device, such as a computer system, and so those skilled in the art will readily recognize that implementations of USB-based networks typically employ a master-slave configuration. In contrast, the various physical incarnations of Ethernet that have been created over a period of many years have often been implemented in either master-slave or peer-to-peer configurations, and in many cases, both configurations have been employed across a single Ethernet-based network with at least some devices serving in a mixture of master, slave and/or peer roles.

In embodiments of the network 9000 in which a peer-to-pear configuration is employed, initialization of the network 9000 may entail at least one of the remote device 950, the device 650 or the three devices 510 attempting to contact at least one other of these devices in preparation for exchanging commands and/or data therebetween. Where all three of the devices 510 are speakers and where the remote device 950 is meant to supply pieces of audio data for output by each of the three devices 510, the remote device 950 may be the device that attempts to contact other devices as part of attempting to locate devices able to serve as speakers, and in so doing, the remote device 950 may detect the presence of the three devices 510. Alternatively, it may be one of the devices 510 that attempts to contact other devices as part of attempting to locate companion devices able to serve as speakers with which to coordinate the audible output of pieces of audio data, and then that same one of the devices 510 may attempt to contact the remote device 950 to provide the remote device 950 with information concerning the presence of all three of the devices 510. Similarly, where the device 650 is a camera with a microphone, and where the remote device 950 is meant to receive audio/visual data from the device 650, the remote device 950 may attempt to contact other devices as part of an attempt to locate a device able serve as a source of audio/visual data to the remote device 950, and thereby detect the presence of the device 650 as a possible video data source. Regardless of how the remote device 950 is made aware of the presence of the device 650 and/or the three devices 510, the remote device 950 may respond to the presence of these devices by contacting each of these devices to configure them for operation with the remote device 950, and/or the remote device 950 may configure data exchanged with these devices in a manner that takes into account their presence as will be discussed in greater detail.

In embodiments of the network 9000 in which a master-slave configuration is employed, the remote device 950 may be the master device with the device 650 and the devices 510 all downstream of the remote device 950 through the device hub 110 and functioning in the role of slave devices to the remote device 950. In such a master-slave configuration, multiple tiers of master-slave relationships may be defined within the network 9000 in which the remote device 950 is the master of the device hub 110, and the device hub 110 is, in turn, the master of each of the devices 510 and 650. Initialization of the network 9000 may entail the remote device 950 performing various tests to determine what devices are downstream from the remote device 950, and may detect one or more of the device 650, the three devices 510 and the device hub 110 in the process. Again, the remote device 950 may respond to detecting the presence of the device 650 and the devices 510 in various ways as will be discussed in greater detail.

Regardless of how one device is made aware of the presence of another device, the process of being made aware of the presence of the other device may include being provided with data concerning characteristics of the operation of that other device. By way of example, being made aware of the presence of the device 650 may include being provided with data concerning various aspects of the camera functionality of the device 650, such as the resolution, the limits of the viewing angle, the frame rate, the manner in which color is encoded, etc. Such data may aid another device, such as the remote device 950, in determining whether or not the characteristics of the device 650 are compatible with an intended use of the device 650 and/or in enabling proper interpretation of the video data to be supplied by the device 650. By way of another example, being made aware of the presence of one or more of the three devices 510 may include being provided with data concerning various aspects of the audio output functionality of each of the devices 510, such as limits on frequency range of audio output, a frequency response curve, a maximum volume or decibel level, audio data sampling rates, audio data bit formats, etc. Such data may aid another device in determining whether or not the characteristics of each of the devices 510 are compatible with an intended use of the devices 510 and/or in enabling proper transmission of pieces of audio data to each of the devices 510.

Receipt of data concerning various aspects of the functionality of multiple devices may also allow either the device hub 110 or another device to determine how to divide various aspects of a function among different ones of those multiple devices. By way of example, in an assembly having one each of a pair of the devices 510 positioned alongside the left edge 916 and the right edge 917 to serve as left and right speakers, and having an alternate device optimized to audibly output lower frequency sounds positioned alongside the bottom edge 915 to serve as a subwoofer, data concerning aspects of the functionality of these devices may be employed to divide appropriate ranges of frequencies of audio data among them in a manner not unlike an audio crossover. The remote device 950 may perform this crossover function on audio data and then separately transmit higher frequency left and right audio channel pieces of audio data to appropriate ones of the two devices 510 while transmitting lower frequency pieces of audio data to the subwoofer device. Alternatively, either the remote device 950 or the device hub 110 may assign differing audio channels and frequency ranges to each of these devices. Then, as the remote device 950 transmits multi-channel pieces of audio data made up of the full range of frequencies of audio data to both of the devices 510 and to the subwoofer device, each of these devices audibly outputs only the pieces of audio data representing the audio channels assigned to it, and while employing a filter to limit output to only the range of frequencies assigned to it.

Although not specifically depicted in FIG. 4a, it is preferred that the network 9000 distribute electrical power among one or more of the remote device 950, the device 650 and each of the devices 510. It is envisioned that the device hub 110 be capable of receiving power provided by the remote device 950 through the connector 139 and/or by a power source separate from any of these devices through still another connector (not shown) disposed on the casing of the device hub 110. It is also envisioned that, in an effort to achieve the desired visual benefit of reduced visibility of cabling, devices coupled to the device hub 110 through the arms 150 are provided with power by the device hub 110 through the connectors 134, 135, 136 and 137, and through the arms 150. In embodiments in which the network 9000 is implemented using USB, a variant of USB may be used that is known as PoweredUSB promulgated by International Business Machines Corporation (IBM®) of Armonk, N.Y., in which connectors are defined that are physically compatible with the USB standard are supplemented with additional higher capacity power contacts to convey power of differing voltages and of greater amperage than is otherwise supported by the USB standard. Alternatively, in embodiments in which the network 9000 is implemented using Ethernet, a variant of Ethernet may be used that is known as IEEE 802.3 or Power Over Ethernet (POE) promulgated by IEEE, in which twisted pairs of conductors and contacts of otherwise typical 8-pin RJ-45 Ethernet connectors are employed in additionally conveying power.

The ability of the device hub 110 to be mounted to the rear face 913 of the panel 910 such that the physical position of the device hub 110 relative to the front face 912 of the panel 910 is known enables the attribute of locality to be associated with each of the connectors 134, 135, 136 and 137. In other words, with the device hub 110 mounted with the front face 112 of the device hub 110 in contact with the rear face 913 of the panel 910, and with the coupling 124 incorporating the connector 134 facing upwards (as best seen in FIGS. 1d and 3a), it is then known that the coupling 125 incorporating the connector 135 faces downward, the coupling 126 incorporating the connector 136 faces leftward, and the coupling 127 incorporating the connector 137 faces rightward. This, in turn, allows the positions of devices coupled to each of the connectors 134, 135, 136 and 137 through corresponding ones of the arms 150 to be known such that each of those devices is given the attribute of locality as determined by which one of the connectors 134, 135, 136 and 137 they are coupled with. As a result, the device 650 is given the attribute of being alongside the top edge 914 of the panel 910, while different ones of the three device 510 are given the attributes of being alongside the bottom edge 915, the left edge 916 and the right edge 917.

Information regarding the locality of each of these devices may be provided by the device hub 110 to one or more of the remote device 950, the device 650 and the devices 510. One or more of these devices may respond to this information in any of a variety of ways, including and not limited to, altering a characteristic of how they perform their own functions, altering a characteristic of how they operate another device, and altering a characteristic of commands and/or data that they exchange with another device. By way of example, upon either detecting or receiving information regarding the presence of all three of the devices 510, and upon being provided with locality data indicating the localities of each of the three devices 510 relative to the device hub 110 (and by extension, relative to the panel 910), the remote device 950 may use the locality data to separately convey center channel, left channel and right channel pieces of audio data to the different ones of the devices 510 positioned alongside the bottom edge 915, the left edge 916 and the right edge 917, respectively, of the panel 910. Alternatively, each of the devices 510 may be signaled by either the remote device 950 or the device hub 110 to assign each of the devices 510 only specific audio channels to audibly output. Then, the remote device 950 would output audio data made up of multiple audio channels to each of the devices 510, and each one of those devices 510 would audibly output only the pieces of audio data representing the specific audio channels assigned to it.

Information provided to one device about the presence or absence of another device may be dynamic in nature such that the one device may be caused to respond at a time later than initialization of the network 9000 to the addition or removal of the other device at a later time. Returning to the above example of the remote device 950 separately conveying pieces of audio data representing different audio channels of audio data to differing ones of the device 510, if at some subsequent time the one of the device 510 positioned alongside the bottom edge 915 of the panel were to be removed, either the device hub 110 may signal the remote device 950 that this particular one of the devices 510 is no longer present, or the remote device 950 may receive a signal indicating a failure of that particular one of the devices 510 to continue accepting pieces of audio data representing center channel audio. In response, the remote device 950 may alter its transmission of audio data into the network 9000 to convey only pieces of audio data representing left and right audio channels to the ones of the devices 510 positioned alongside the left edge 916 and the right edge 917, respectively. In switching between providing audio data representing three audio channels and providing audio data representing two audio channels, the remote device 950 may have to perform one or more forms of processing on the audio data to be conveyed to derive the differing quantities of channels. The remote device 950 may either create a simulation of center channel audio with only left and right speakers. Alternatively, the remote device 950 may derive center channel audio from audio data not originally having a piece of audio data representing distinct center channel audio.

FIG. 4b provides a more detailed depiction of a portion of the network 9000 with this depiction including only the remote device 950, the device hub 110 and a single one of the devices 510. The remote device 950 is coupled via one end of the cable 969 to the connector 139 of the device hub 110, with the other end of the cable 969 coupled to a connector 979 of the remote device 950. Not unlike earlier depicted examples, the one of the devices 510 selected as an example is the one of the devices 510 that is coupled to the coupling 127 of the device hub 110 via one of the arms 150 such that the connector 539 of the example device 510 is electrically coupled to the connector 137 of the device hub 110.

The device hub 110 incorporates a processor 140, a storage 142, an interface circuit 149, and the connectors 134, 135, 136, 137 and 139. The processor 140 is configured to access both a routine 144 and data 145 stored within the storage 142, and the processor 140 is configured to access and operate the interface circuit 149 to monitor and control signals conveyed via the connectors 134, 135, 136, 137 and 139. The routine 144 incorporates a sequence of instructions that when executed by the processor 140, causes the processor 140 to perform various tasks. Similarly, the remote device 950 incorporates a processor 980, a storage 982, an interface circuit 989, and the connector 979. The processor 980 is configured to access both a routine 984 and data 985 stored within the storage 982, and the processor 980 is configured to access and operate the interface circuit 989 to monitor and control signals conveyed via the connector 979. The routine 984 incorporates a sequence of instructions that when executed by the processor 980, causes the processor 980 to perform various tasks. Further, the device 510 incorporates a processor 540, a storage 542, an interface circuit 549, an acoustic driver 547 and the connector 539. The processor 540 is configured to access both a routine 544 and data 545 stored within the storage 542. The processor 540 is also configured to access and operate the interface circuit 549 to monitor and control signals conveyed via the connector 539, and is further configured to operate the acoustic driver 547 to output a received piece of audio data in audible form. The routine 544 incorporates a sequence of instructions that when executed by the processor 540, causes the processor 540 to perform various tasks.

Each of the processors 140, 540 and 980 may be any of a variety of types of processing device, including and not limited to, a general purpose processor, a digital signal processor or other more specialized processor having a limited instruction set optimized for a given range of functions, a microcontroller or combinational logic. Each of the storages 142, 542 and 982 may be based on any of a wide variety of information storage technologies, including and not limited to, static RAM (random access memory), dynamic RAM, ROM (read-only memory) of either erasable or non-erasable form, FLASH, magnetic memory, ferromagnetic disk storage, phase-change storage or magneto-optical storage. It is preferred that each of the storages 142, 542 and 982 are at least partially based on some form of solid-state storage technology, and that at least a portion of that solid-state technology be of a non-volatile nature to prevent loss of the routines 144, 544 and 984, respectively.

Each of the routines 144, 544 and 984, upon being executed by the processors 140, 540 and 980, respectively, cause the processors 140, 540 and 980 to operate the interfaces 149, 549 and 989 to initialize at least portions of the network 9000. In one embodiment in which a master-slave configuration is employed, the processor 140 is caused by the routine 144 to operate the interface 149 to test for devices coupled directly to or downstream from each of the connectors 134, 135, 136 and 137, and the processor 980 is caused by the routine 984 to operate the interface 989 to test for devices coupled to or directly downstream from the connector 979. Upon receiving a signal via the connector 539 as a result of the testing by the processor 140, the processor 540 is caused by the routine 544 to respond by operating the interface 549 to convey a portion of the data 545 having information concerning the device 510 to the device hub 110 via the connector 539. Further, upon receiving a signal via the connector 139 as a result of the testing by the processor 980, the processor 140 is caused by the routine 144 to respond by operating the interface 149 to convey both the portion of the data 545 received from the device 510 and a portion of the data 145 having information concerning the device hub 110 to the remote device 950 via the connector 139. In another embodiment in which a peer-to-peer configuration is used, the processors 980 and 540 may be caused to convey a portion of the data 985 having information about the remote device 950 and a portion of the data 545 having information about the device 510, respectively, to the device hub 110. In turn, the processor 140 may be caused to relay those pieces of data to other devices.

Amidst such exchanges of portions of data concerning characteristics of devices, the processor 140 of the device hub 110 may be caused by the routine 144 to convey information concerning the locality of more than one device to one or more devices. In some embodiments, the processor 140 may be caused to convey locality information about a given device to that device to enable that device to be aware of its own locality. Awareness of a device's own locality may be useful, for example, where there is one of the devices 510 coupled to the connector 136 and another of the devices 510 coupled to the connector 137 (as depicted), and the remote device 950 conveys multi-channel audio data to both of the devices 510 through the device hub 110. By being aware of their own locality, the processors 540 of each of those devices 510 are able to select pieces of audio data representing one or more audio channels appropriate to the locality information provided to each of the processors 540, and then operate their respective ones of the acoustic drivers 547 to output those selected audio channels. To put it more precisely, one of the devices 510 is aware that it should output left channel audio, and the other is aware that it should output right channel audio. In other embodiments, the processor 140 may be caused to convey locality information about one device to another device to enable that other device to more effectively interact with the one device. Awareness of the locality of one or more other devices may be useful, for example, where the remote device 950 must assign differing audio channels to be output by differing ones of a pair of devices 510 coupled to the connectors 136 and 137 of the device hub 110. More precisely, the processor 980 is able to employ the locality information provided to it concerning the localities of each of the two devices 510 to operate the interface 989 to separately contact each of those devices 510 to separately provide pieces of audio data representing audio channels that are appropriate to each of those devices 510.

Locality may also be employed in assigning names or other user-friendly indicators to designate one device from among multiple devices. By way of example, the relative localities of the three different ones of the devices 510 may be used in a user interface by which a user wishes to separately configure various settings of different ones of these devices 510. More specifically, the processor 980 may be caused by the routine 984 to automatically assign names such as "left channel speaker," "center channel speaker" and "right channel speaker" in a user interface that may be visually displayed by the panel 910 to allow the user to more easily distinguish a setting for one of the three devices 510 from another. By way of another example, where one each of a pair of removable media storage devices are coupled to the couplings 126 and 127 of the device hub 110, the relative localities of the two removable media storage devices may be employed to automatically create visual icons for display that are meant to distinguish one from the other, possibly incorporating the letters "L" and "R" reflecting that one is to the left of the panel 910 and the other is to the right.

FIG. 4c depicts at least a portion of another network 9100 in which a device 710 in the form of a typical computer mouse is to be coupled to the remote device 950 through the device hub 110, where the remote device 950 is meant to employ the device 710 to enable a user to provide user input. The device 710 is meant to be movable by the user relative to other devices, and therefore is meant to be connected through a connector 739 at the end of a cable 729. In another example in which locality information is employed, the device hub 110 may provide the remote device 950 with locality information regarding whether the connector 739 of the device 710 is connected by the user to the connector 136 disposed on the left edge 116 of the device hub 110 or to the connector 137 disposed on the right edge 117 of the device hub 110. In so doing, the device hub 110 enables the remote device 950 to take advantage of what may be a tendency by at least some users to couple the device 710 to the device hub 110 in a manner that is indicative of which hand the user intends to operate the device 710 with. More precisely, if the connector 739 is coupled to the connector 136, it may be more likely that the user will operate the device 710 with his/her left hand, whereas if the connector 739 is coupled to the connector 137, it may be more likely that the user will operate the device 710 with his/her right hand. The remote device 950 may employ this information to configure manually-operable controls of the device 710 for left or right handed operation, at least until such configuration based on locality is overridden by the user.

Figure 5B:
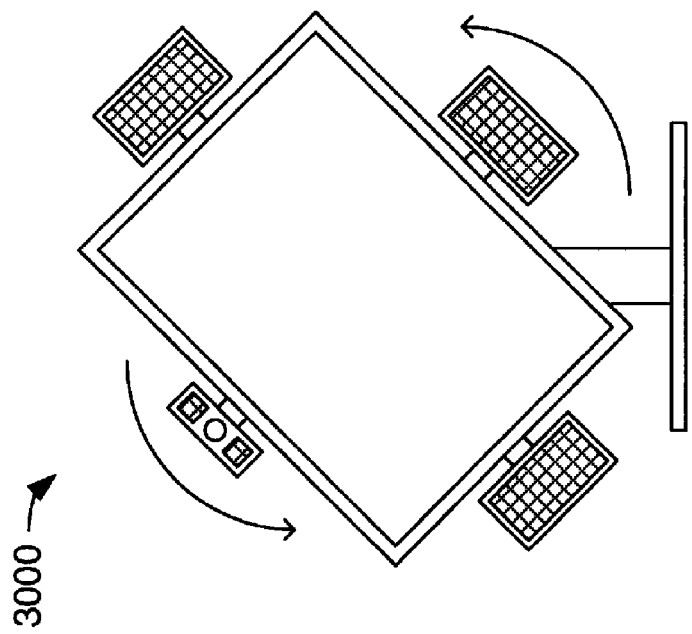
FIG. 5a, 5b and 5c are front elevational views of an assembly depicting the rotation of the panel of the assembly between portrait and landscape modes.
Figure 5A:
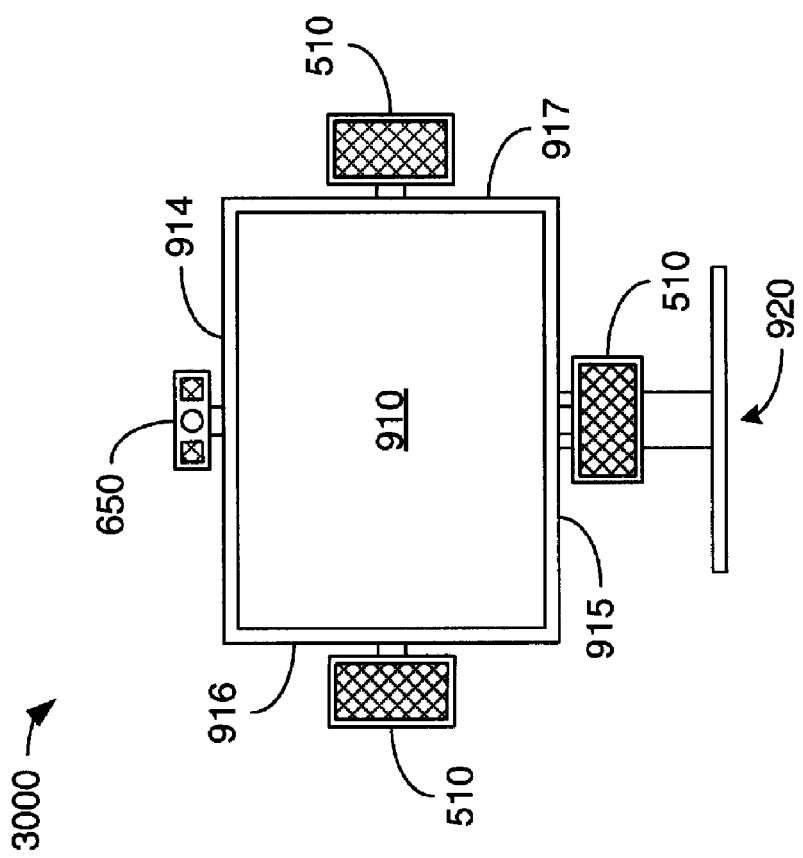
Figure 5D:
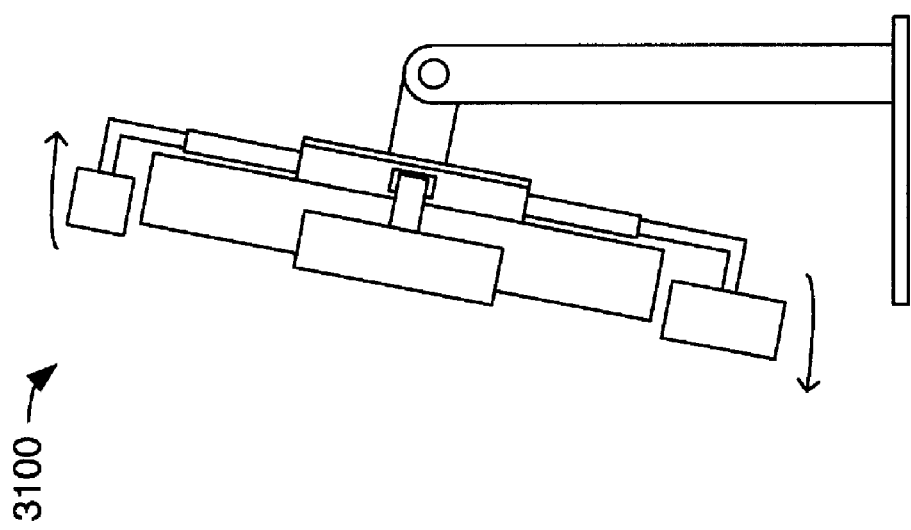
FIGS. 5d, 5e and 5f are side elevation views of an assembly depicting the tilting of the panel of the assembly between downward angle and upward angle positions.
Figure 5C:
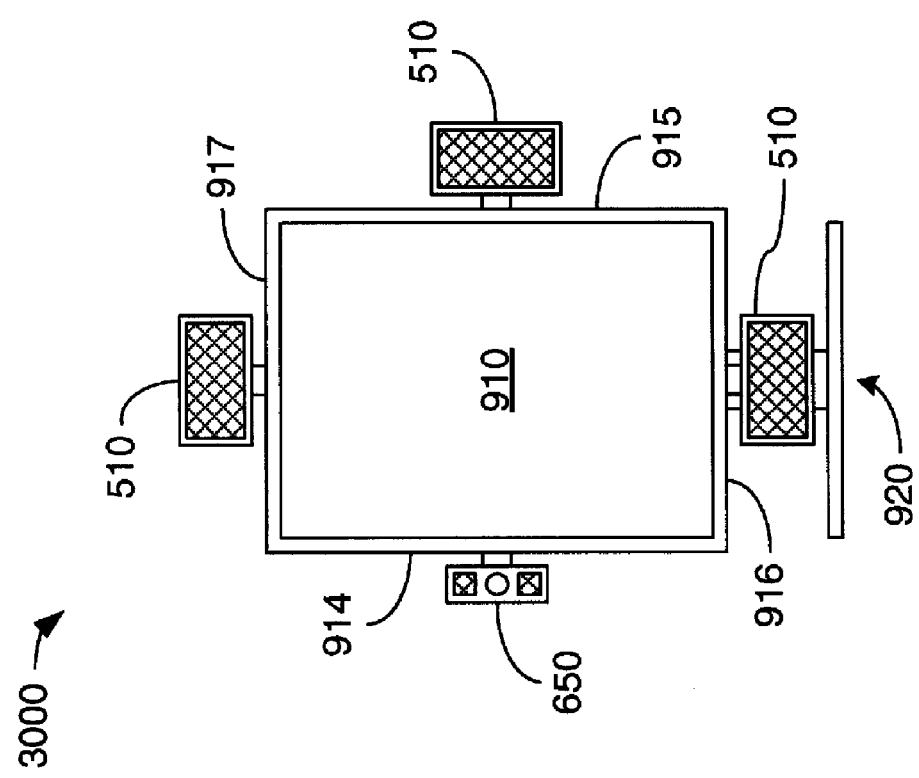
Figure 5F:
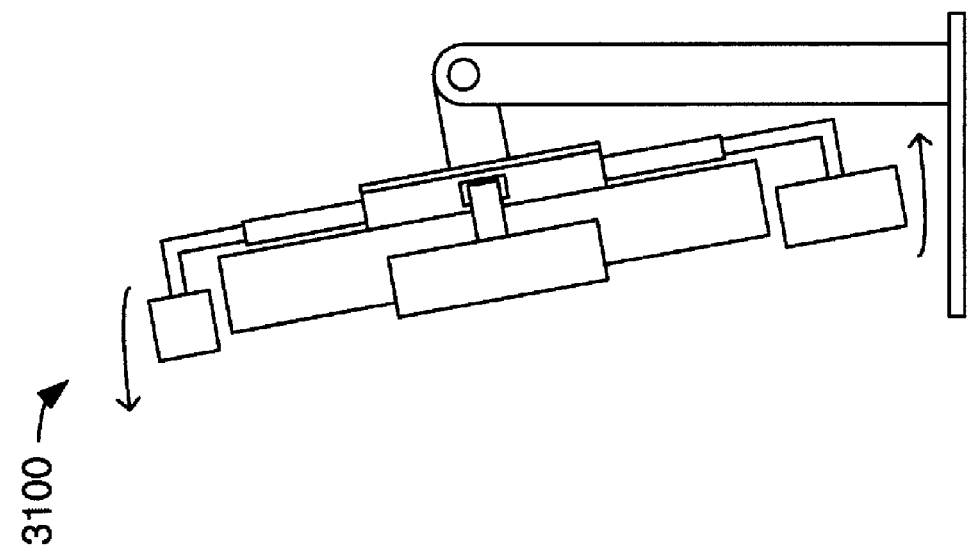
Figure 5E:
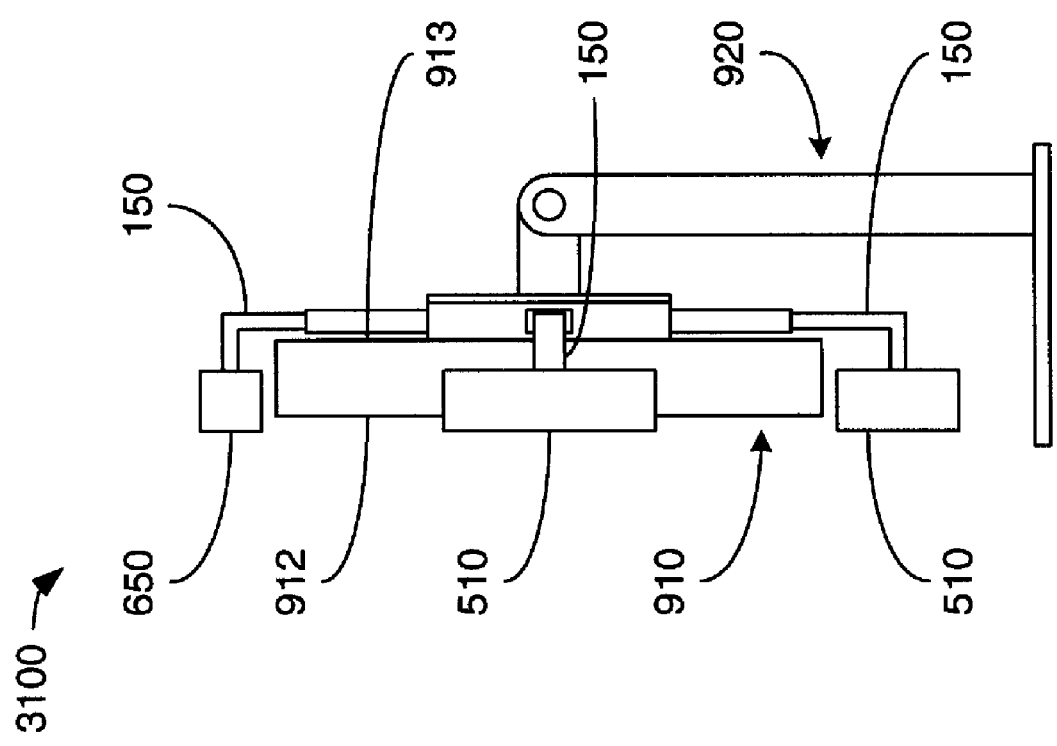
Figure 5G:
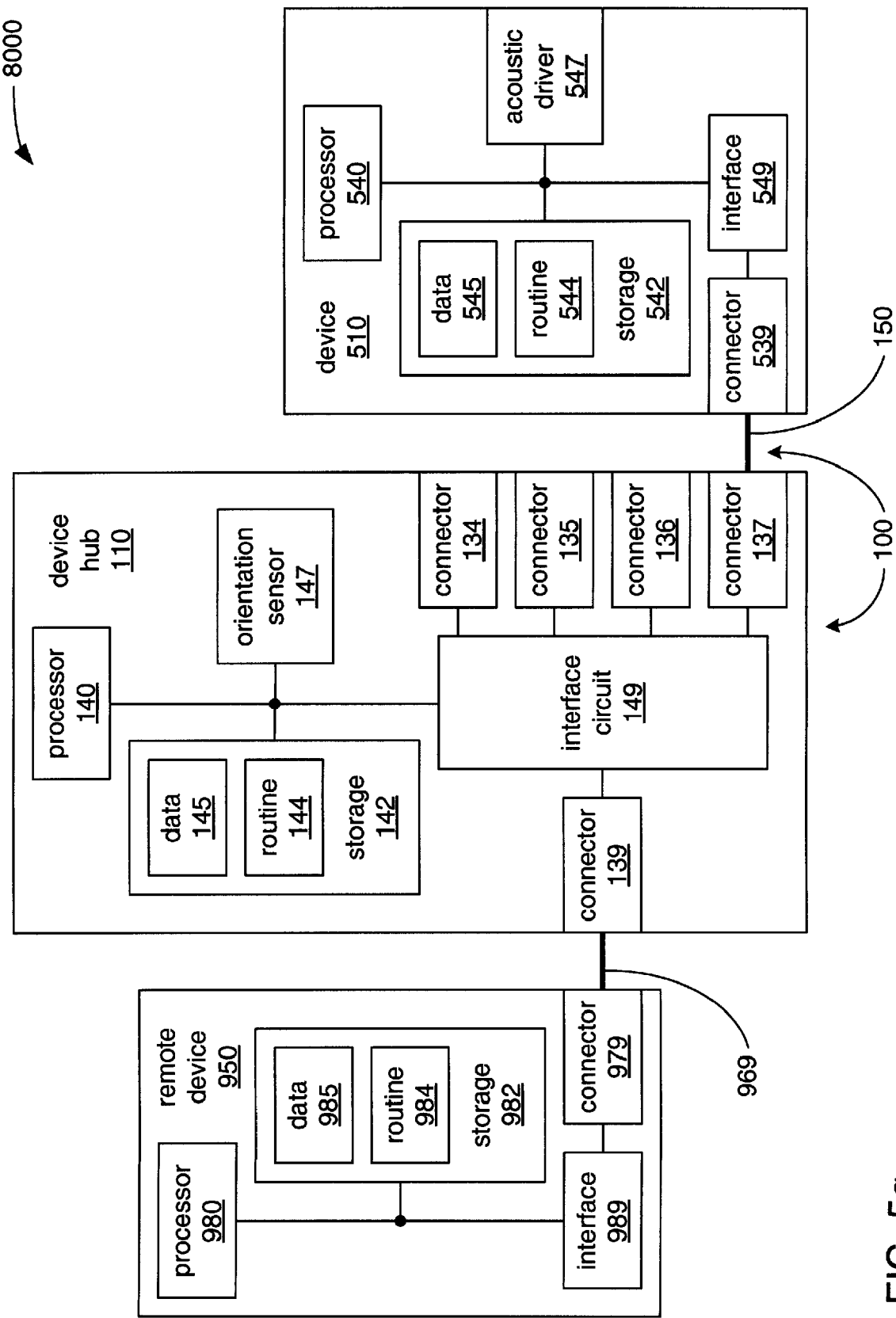
FIG. 5g is a block diagram of interconnection of another network associated with an assembly.

FIGS. 5a, 5b, 5c, 5d, 5e, 5f and 5g, taken together, depict assemblies or portions of assemblies incorporating variants of the flat panel display 900 and the device bracket 100 that are capable of detecting orientation. FIGS. 5a-c are front elevation views of an assembly 3000 depicting the rotation of the panel 910 between portrait and landscape modes. FIGS. 5d-f are side elevation views of the assembly 3100 depicting the tilting of the panel 910 between a tilted up position in which the front face 912 of the panel 910 is angled upward and a tilted down position in which the front face 912 of the panel 910 is angled downward. FIG. 5g is a block diagram providing a more detailed view of a portion of the interconnections of a network 8000 that may be employed in either of the assemblies 3000 and 3100. Not unlike FIG. 4b providing a more detailed view of a portion of the network 9000, in FIG.

5g, one of the devices 510 is employed as an example in depicting the electrical coupling of a device to the device hub 110.

Turning to FIG. 5g, the depicted portion of the network 8000 is substantially similar to the portion of the network 9000 depicted in FIG. 4b. A significant difference between these two depicted network portions is that the device hub 110 of the network 8000 additionally incorporates an orientation sensor 147 that detects the orientation of the casing of the device hub 110 relative to the direction of Earth's gravitational pull. To put it more simply, the orientation sensor 147 determines which direction is up. Therefore, as the panel 910 is rotated between portrait and landscape modes as shown in FIGS. 5a through 5c, and as the panel 910 is tilted between angled downward and angled upward positions as shown in FIGS. 5d through 5f, the orientation sensor 147 is able to detect the resulting changes in the orientation of the casing of the device hub 110 relative to the direction of Earth's gravitational pull.

In various embodiments, the processor 140 may be caused by the routine 144 to either repeatedly query the orientation sensor 147 and/or to do so in response to a request from a device coupled to the device hub 110 for orientation data. This orientation data may be provided either to devices coupled to the device hub 110 via the arms 150 such that those devices are caused to move with the panel 910 as the panel 910 is moved, or to devices coupled to the device hub 110 via a cable such that those devices are able to remain stationary as the panel 910 is moved. In a manner not unlike the provision of locality data discussed earlier, a device may employ the orientation data to modify either the manner in which the device, itself, performs a given function or the manner in which the device interacts with another device.

By way of example, each of the three devices 510 may employ orientation data to alter one or more characteristics of the manner in which their respective acoustic drivers 547 are operated to counteract the manner in which a given angle of tilt might affect their audible output of audio data received from the remote device 950. Alternatively, the remote device 950 may employ the same orientation data to alter one or more characteristics of the audio data that the remote device 950 conveys to the devices 510 to achieve the same counteractive effect. By way of another example, the remote device 950 may employ orientation data indicating a change between portrait and landscape modes to reassign audio channels among the three devices 510 and/or to provide one or more combined audio channels to one or more of the devices 510. More specifically, while the panel 910 is rotated to the landscape mode depicted in FIG. 5a, the remote device 950 may direct pieces of audio data representing left channel audio to the device 510 alongside the left edge 916 of the panel 910, center channel audio to the device 510 alongside the bottom edge 915, and right channel audio to the device 510 alongside the right edge 917. However, while the panel 910 is rotated to the portrait mode depicted in FIG. 5c, maintaining such an allocation of audio channels among the three devices 910 may provide a user of the assembly 3000 with a directionally confusion audio output. Therefore, while the panel 910 is rotated to the portrait mode depicted in FIG. 5c, the remote device 950 may combine the left, center and/or right audio channels into a single audio channel and may provide pieces of audio data representing that single audio channel to one or both of the devices 510 alongside both the left edge 916 and the right edge 917, or to all three of the devices 510. Alternatively, while the panel 910 is rotated to the portrait mode, the remote device 950 may modify the audio data to a form having only left and right audio channels, thereby eliminating the center audio channel, and may provide pieces of audio data representing left channel audio to one or both of the devices 510 alongside the left edge 916 and the right edge 917, while providing pieces of audio data representing right channel audio to the device 510 alongside the bottom edge 915 in order to continue providing at least a stereo audio output.

By way of another example, the device 650 may employ orientation data to alter the orientation of video data that the device 650 captures in its camera function and conveys to the remote device 950. More specifically, as those skilled in the art will readily recognize, the pixels of video frames making up video data are typically organized into hundreds of horizontal scanlines that are each scanned from left to right with the scanlines being scanned in an order from the top-most scanline to the bottom-most scanline, and therefore, each video frame has an inherent orientation. Therefore, when the panel 910 is rotated between portrait and landscape modes such that the device 650 is also rotated 90 degrees, the video frames of video captured by the device 650 are also be rotated 90 degrees. To correct this, the device 650 may employ orientation data to correct the organization of pixels into scanlines to account for such rotation before conveying video frames to the remote device 950. Alternatively, the remote device 950 may employ orientation data to perform such correction of video frames received from the device 650. By way of another example, the device 650 may employ orientation data to counteract the effects of a change in tilt of the panel 910. More specifically, in embodiments of the device 650 in which the lens and/or image capture component of the device 650 are capable of being moved to adjust for tilt, the device 650 may employ orientation data to automatically adjust for changes in tilt, perhaps to ensure that the view captured by the device 650 is always along a level line of sight.

Amidst the provision of either or both of locality and orientation data as has been discussed, such data may be accompanied with an indication of whether a given device is coupled to the device hub 110 with an arm such that there is a mechanical interconnection between that device and the device hub 110 or a cable such that the location and orientation of that device may well have little to do with the location or orientation of the device hub 110. Various possible mechanisms may be incorporated into one or more of the couplings 124, 125, 126 and 127 to enable a determination of whether a cable or one of the arms 150 is employed in coupling a given device. Such possible mechanisms include and are not limited to a mechanical or other form of switch that is engaged when one of the arms 150 is employed and not engaged when a cable is employed, an electrical contact within one or more of the connectors 134, 135, 136 and 137 that is engaged or otherwise provided with an electrical signal when one of the arms 150 is employed and not when a cable is employed, and data storage device such as a serial EPROM (erasable programmable read-only memory) incorporated into each of the arms 150 that identifies each of the arms to the device hub 110.

Figure 6A:
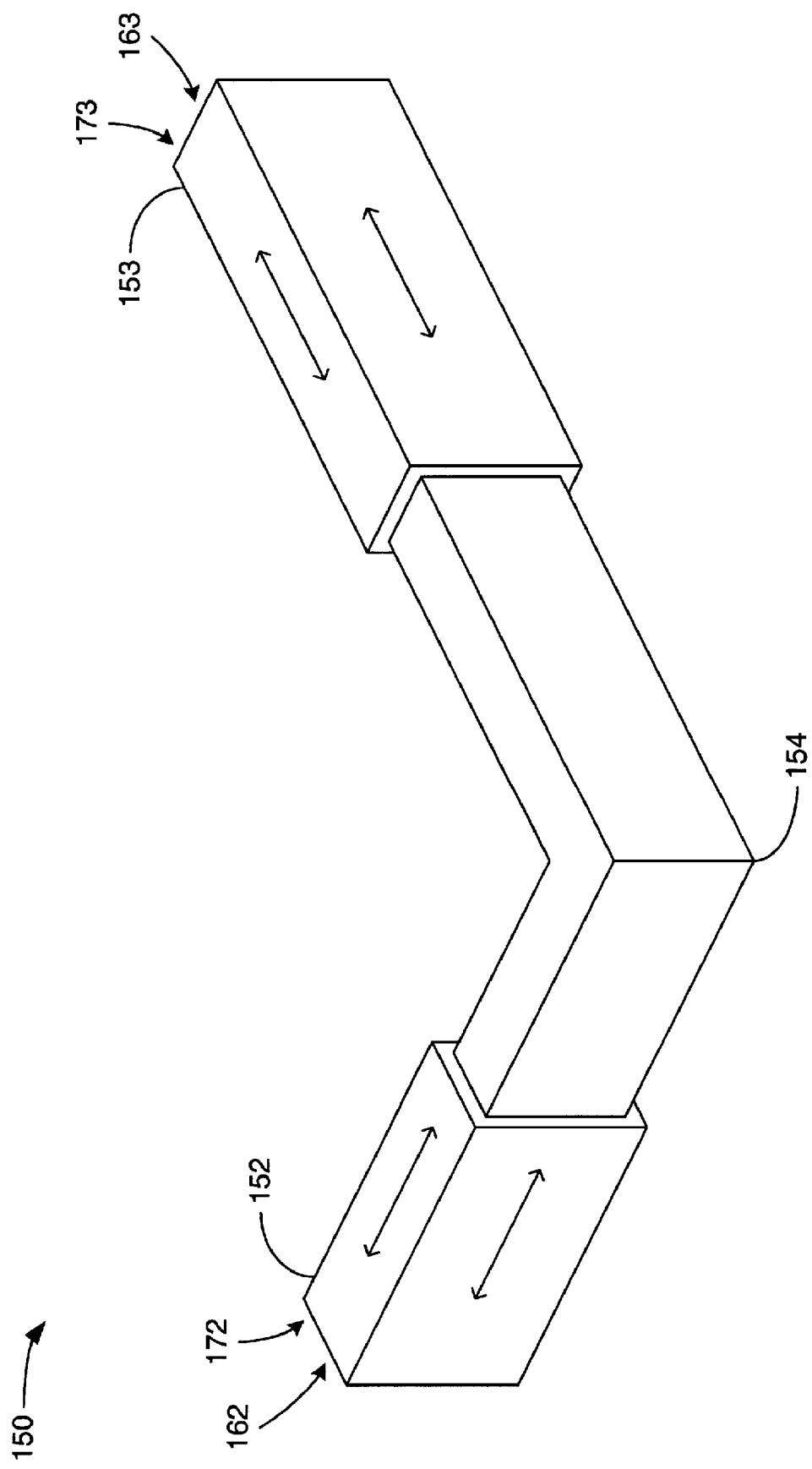
FIGS. 6a and 6b are perspective views of arms having relatively movable ends.
Figure 6B:
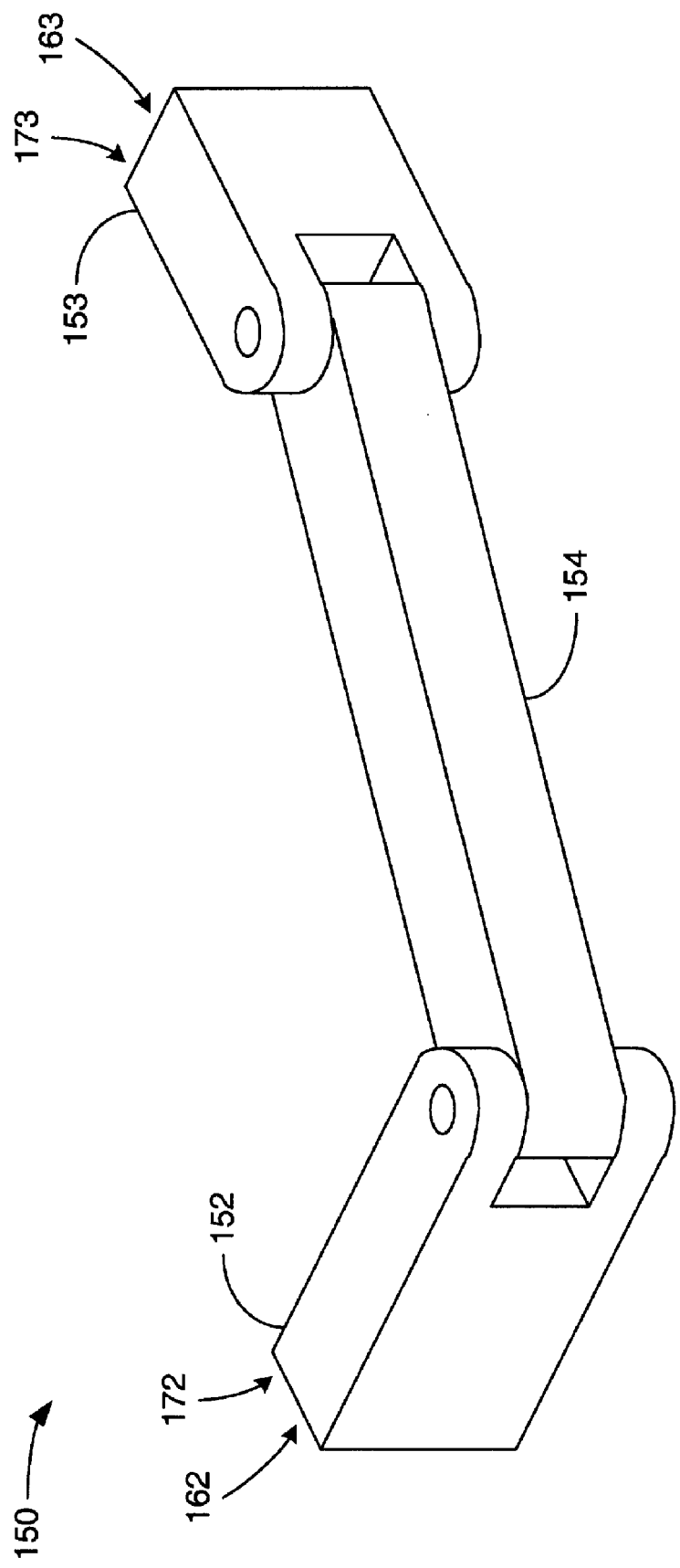
Figure 6C:
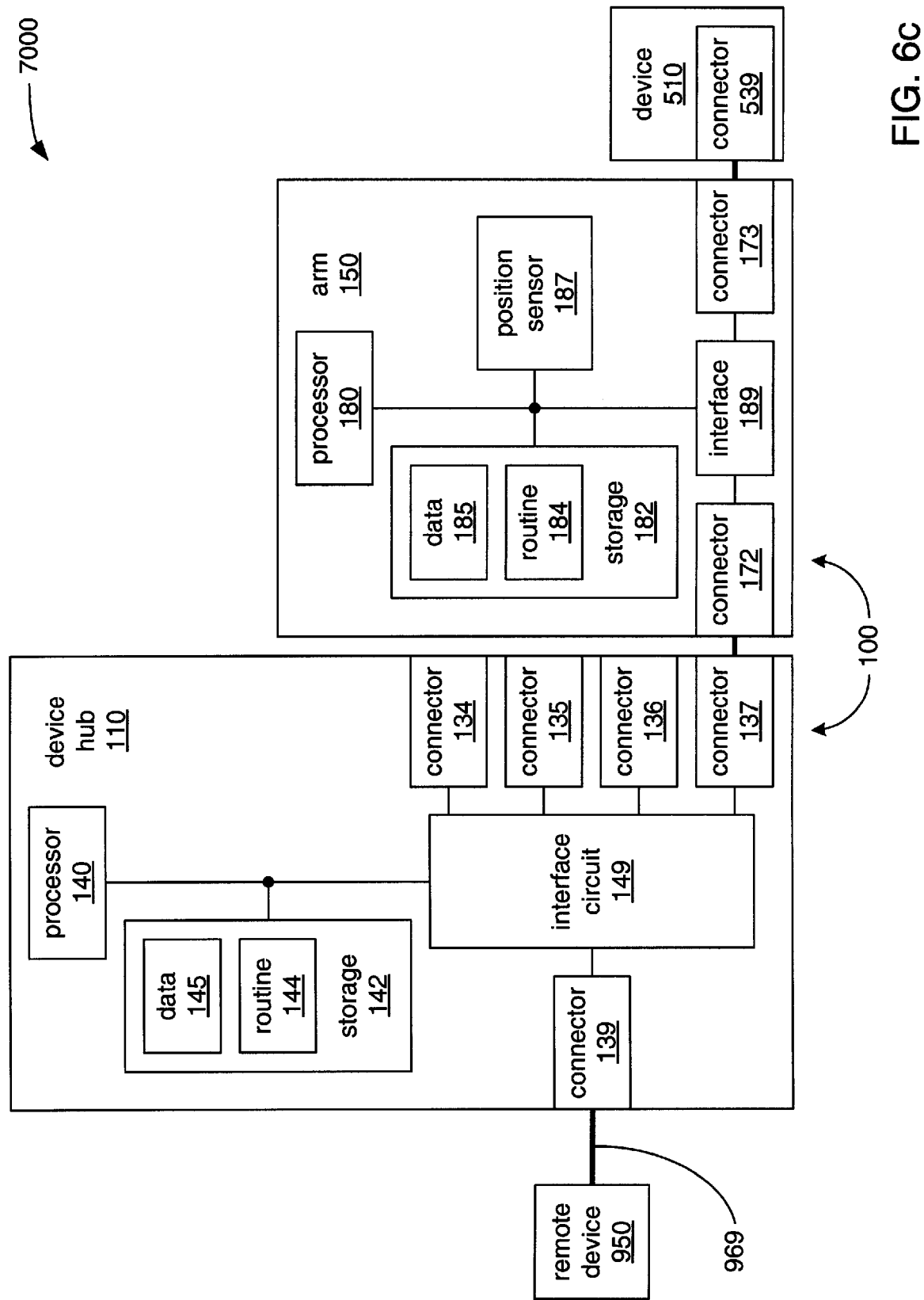
FIGS. 6c and 6d are block diagrams of portions of a network associated with either of the arms of FIGS. 6a and 6b.
Figure 6D:
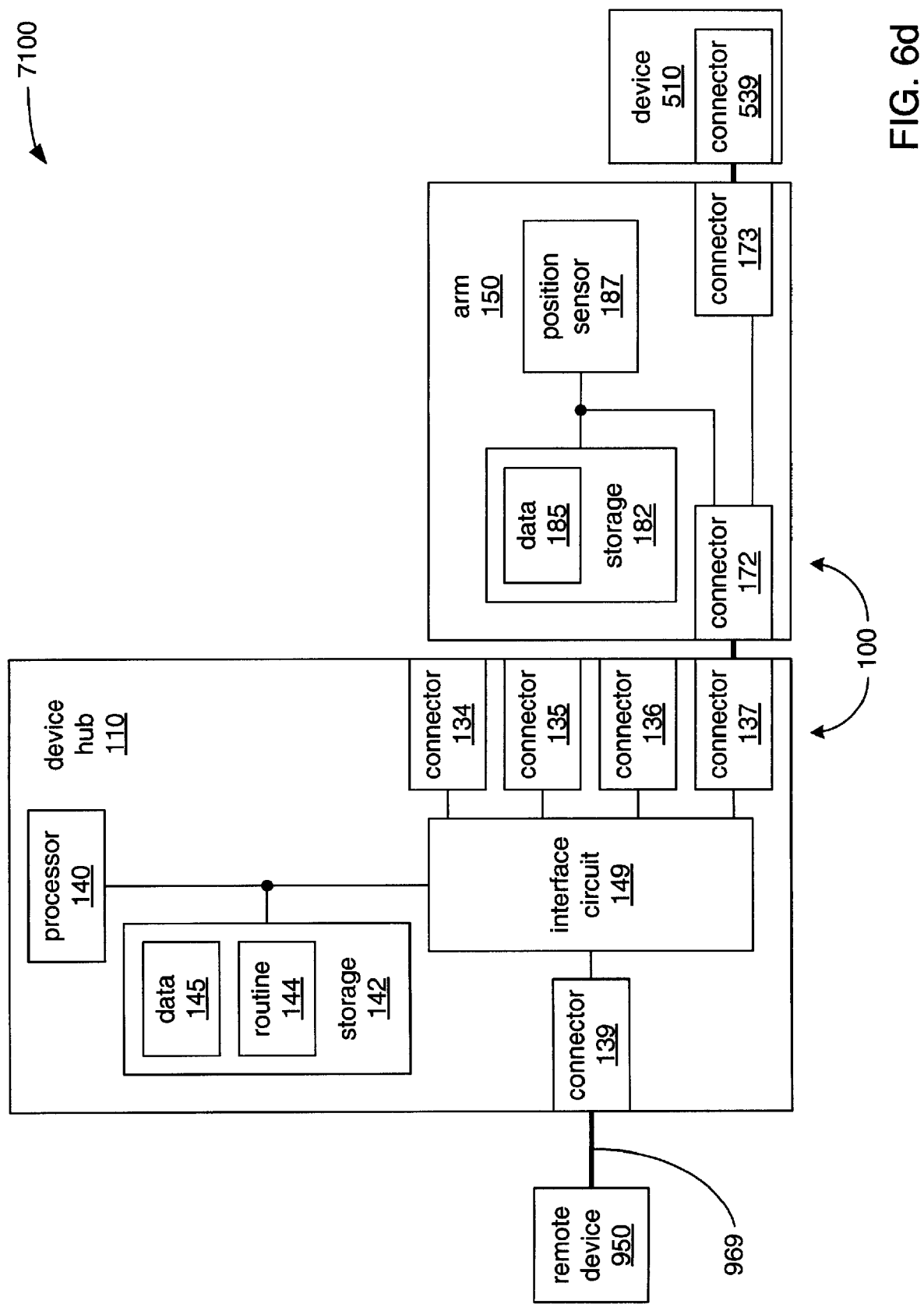

FIGS. 6a, 6b, 6c and 6d, taken together, depict assemblies or portions of assemblies incorporating variants of the flat panel display 900 and the device bracket 100 that are capable of determining the position of a device relative to the device hub 110, and capable of detecting when that relative position has been changed as a result of a portion of one of the arms 150 being moved relative to the device hub 110. FIGS. 6a-b are perspective views of possible forms of the arms 150 having movable portions that allow the physical configuration of the arms 150 to be altered. FIG. 6c is a block diagram providing a more detailed view of a portion of the interconnections of a network 7000 in which a form of the arms 150 having at least one movable portion are used. FIG. 6d is a block diagram providing a more detailed view of a portion of the interconnections of an alternate network 7100 in which an alternate form of the arms 150 having at least one movable portion are used. In both FIGS. 6c and 6d, one of the devices 510 along with an accompanying one of the arms 150 is once again employed as an example in depicting the electrical coupling of a device to the device hub 110.

Both FIGS. 6a and 6b depict two variants of the example arm 150 in which end 152 is movable relative to end 153. In both variants, such relative movement has the effect of causing the coupling 162 incorporating a connector 172 and the coupling 163 incorporating a connector 173 to be moved relative to each other. With the example arm 150 coupled to the coupling 127 of the device hub 110 via the coupling 163 and with the example arm 150 coupled to the coupling 529 of the example device 510 via the coupling 162, movement of the couplings 162 and 163 relative to each other necessarily accompanies movement of the example device 510 relative to the device hub 110. In FIG. 6a, the ends 152 and 153 are slidably movable in a telescopic manner relative to a mid portion 154 having an elbow in a manner that allows the example device 510 to be moved closer to and further away from the device hub 110, as well as allowing the example device 510 to be moved forwardly and rearwardly relative to the device hub 110. In FIG. 6b, the ends 152 and 153 are coupled via hinges to a substantially straight mid portion 154 in a manner that allows movement of the example device 510 relative to the device hub 110 through two arcs of movement. As those skilled in the art will readily recognize, numerous other possible physical configurations of the example arm 150 are possible enabling a wide variety of possible movements through the use of hinges, ball-and-socket joints, telescoping members, elastic members, etc. It should also be noted that although the variants of the example arm 150 depicted in FIGS. 6a and 6b show an accommodation of movement of the example device 510 towards and away from the device hub 110, as well as forwardly and rearwardly relative to the device hub 110, other variants of an arm 150 (such as those incorporating one or more ball-and-socket joints) may accommodate a far greater freedom of movement of the example device 510 relative to the device hub 110, including movement following an edge of the panel 910 and movement in which the example device 510 is rotated in panning and/or tilting motions relative to the device hub 110.

Turning to FIG. 6c, the depicted portion of the network 7000 is substantially similar to the portion of the network 9000 depicted in FIG. 4b with the example arm 150 interposed between the device hub 110 and the example device 510, and conveying electrical signals therebetween. However, a significant difference between these portions of the networks 7000 and 9000 is that the arm 150 additionally incorporates a processor 180, a storage 182, a position sensor 187, an interface circuit 189, and connectors 172 and 173. The processor 180 is configured to access both a routine 184 and data 185 stored within the storage 182, and the processor 180 is configured to access and operate the interface circuit 189 to monitor and control signals conveyed via the connectors 172 and 173. The routine 184 incorporates a sequence of instructions that when executed by the processor 180, causes the processor 180 to perform various tasks. Among those tasks is operating the position sensor 187 to detect a current position and/or a change in position of at least one portion of the example arm 150 relative to another.

Not unlike the aforedescribed processors 140, 540 and 980, the processor 180 may be any of a variety of types of processing device, including and not limited to, a general purpose processor, a digital signal processor or other more specialized processor having a limited instruction set optimized for a given range of functions, a microcontroller or combinational logic. Also, not unlike the aforedescribed storages 142, 542 and 982, the storage 182 may be based on any of a wide variety of information storage technologies, including and not limited to, static RAM, dynamic RAM, ROM of either erasable or non-erasable form, FLASH, magnetic memory, ferromagnetic disk storage, phase-change storage or magneto-optical storage. It is preferred that the storage 182 be at least partially based on some form of solid-state storage technology, and that at least a portion of that solid-state technology be of a non-volatile nature to prevent loss of the routine 184.

The position sensor 187 may take any of a wide variety of possible forms, partly depending on the physical configuration of the example arm 150 and the manner in which the ends 152 and 153 are movable relative to each other. Possible implementations of the sensor 187 include and are not limited to one or more strain gauges, one or more linear or rotary potentiometers, and one or more optically scanned scales.

As depicted in FIG. 6c, the internal architecture of the example arm 150 is that of a device meant to be interposed between two other devices not unlike a hub or repeater in a network, wherein electrical signals exchanged between the device hub 110 and the example device 510 are captured and repeated between the connectors 172 and 173 with the processor 180 being caused by the routine 184 to be actively engaged in this. With such an architecture, it may be that the example arm 150 is distinctly detectable as another device on the network, possibly identifying itself during initialization of the network 7000 as a hub having only one downstream device (namely the example device 510, in this case). Alternatively, the example arm 150 may be configured to identify itself only to the device hub 110 in response to the processor 140 being caused by the routine 144 to perform a test to locate and identify such devices as the example arm 150, thereby resulting in devices other than the device hub 110 remaining unaware of the presence of the example arm 150.

In various embodiments, the processor 180 may be caused by the routine 184 to either repeatedly query the position sensor 187 and/or to do so in response to a request for position data from the device hub 110, a device coupled to the device hub 110 and/or the example device 510. This position data may be provided to the device hub 110, devices coupled to the device hub 110 and/or the example device 510. Where the position data is provided by the example arm 150, it may be expressed in any of a number of ways, including and not limited to, being expressed as a difference between three-dimensional coordinates associated with the couplings 162 and 163 of the example arm 150. However, where the position data is relayed by the device hub 110 to other devices, the processor 140 may be caused by the routine 144 to provide a form of the position data that is modified from the position data provided by the example arm 150 to reflect dimensions and/or other physical characteristics of the device hub 110. The results of this modification of position data may be that other devices are provided with position data that describes the position of the coupling 162 of the example arm 150 relative to a reference point of the casing of the device hub 110, rather than relative to the coupling 163.

Turning to FIG. 6d, the depicted portion of the network 7100 is also substantially similar to the portion of the network 9000 depicted in FIG. 4b with the example arm 150 interposed between the device hub 110 and the example device 510, and conveying electrical signals therebetween. However, unlike the network 7000, a significant difference between the networks 7100 and 9000 is that the arm 150 additionally incorporates a storage 182 and a position sensor 187, but does not incorporate its own processor to detect a current position and/or change in position of at least one portion of the example arm 150 relative to another. Instead, the position sensor 187 is made available to be accessed by the processor 140 of the device hub 110 to enable the routine 144 to cause the processor 140 to directly determine such a current position and/or change in current position. Further, the storage 182 is made available to be accessed by the processor 140 to enable the routine 144 to cause the processor 140 to access the data 185 and thereby obtain information regarding operation of the position sensor 187 and/or various physical characteristics of the example arm 150. The processor 140 is then caused by the routine 144 to provide position data to devices coupled to the device hub 110 and/or the example device 510, and may be expressed in any of a number of ways, including and not limited to, being expressed as a difference between three-dimensional coordinates associated with the coupling 162 and a reference point of the casing of the device hub 110. The manner in which the position sensor 187 and/or the storage 182 are made available to the processor 140 of the device hub 110 may be through the provision of one or more electrical contacts in the connector 172 that are entirely separate from other contacts employed in exchanging commands and/or data between the device hub 110 and the example device 510.

Whether the position data is provided by the example arm 150, directly, or in a modified form by the device hub 110, a device provided with position data may employ the position data to modify either the manner in which the device, itself, performs a given function or the manner in which the device interacts with another device.

By way of example, each of the three devices 510 may employ orientation data to alter one or more characteristics of the manner in which their respective acoustic drivers 547 are operated to counteract the manner in which a given angle of tilt might affect their audible output of audio data received from the remote device 950. Alternatively, the remote device 950 may employ the same orientation data to alter one or more characteristics of the audio data that the remote device 950 conveys to the devices 510 to achieve the same counteractive effect. By way of another example, the remote device 950 may employ orientation data indicating a change between portrait and landscape modes to reassign audio channels among the three devices 510 and/or to provide one or more combined audio channels to one or more of the devices 510. More specifically, while the panel 910 is rotated to the landscape mode depicted in FIG. 5a, the remote device 950 may direct pieces of audio data representing left channel audio to the device 510 alongside the left edge 916 of the panel 910, center channel audio to the device 510 alongside the bottom edge 915, and right channel audio to the device 510 alongside the right edge 917. However, while the panel 910 is rotated to the portrait mode depicted in FIG. 5c, maintaining such an allocation of audio channels among the three devices 910 may provide a user of the assembly 3000 with a directionally confusion audio output. Therefore, while the panel 910 is rotated to the portrait mode depicted in FIG. 5c, the remote device 950 may combine the left, center and/or right audio channels into a single audio channel and may provide pieces of audio data representing that single audio channel to one or both of the devices 510 alongside both the left edge 916 and the right edge 917, or to all three of the devices 510. Alternatively, while the panel 910 is rotated to the portrait mode, the remote device 950 may modify the audio data to a form having only left and right audio channels, thereby eliminating the center audio channel, and may provide pieces of audio data representing left channel audio to one or both of the devices 510 alongside the left edge 916 and the right edge 917, while providing pieces of audio data representing right channel audio to the device 510 alongside the bottom edge 915 in order to continue providing at least a stereo audio output.

By way of another example, the device 650 may employ orientation data to alter the orientation of video data that the device 650 captures in its camera function and conveys to the remote device 950. More specifically, as those skilled in the art will readily recognize, the pixels of video frames making up video data are typically organized into hundreds of horizontal scanlines that are each scanned from left to right with the scanlines being scanned in an order from the top-most scanline to the bottom-most scanline, and therefore, each video frame has an inherent orientation. Therefore, when the panel 910 is rotated between portrait and landscape modes such that the device 650 is also rotated 90 degrees, the video frames of video captured by the device 650 are also be rotated 90 degrees. To correct this, the device 650 may employ orientation data to correct the organization of pixels into scanlines to account for such rotation before conveying video frames to the remote device 950. Alternatively, the remote device 950 may employ orientation data to perform such correction of video frames received from the device 650. By way of another example, the device 650 may employ orientation data to counteract the effects of a change in tilt of the panel 910. More specifically, in embodiments of the device 650 in which the lens and/or image capture component of the device 650 are capable of being moved to adjust for tilt, the device 650 may employ orientation data to automatically adjust for changes in tilt, perhaps to ensure that the view captured by the device 650 is always along a level line of sight.

By being provided with data concerning the presence of other devices, along with locality data, orientation data and/or position data, the ability to provide a user of an assembly of devices (e.g., the assemblies 1000, 2000, 2100, 3000, etc.) in which the devices actually do work more seamlessly together is enabled. The provision of such data may be used to enable such devices to automatically respond to a user adding or remove devices, altering the relative positions of devices and/or moving an assembly of devices about. Such automatic responses can be especially beneficial in the case of devices performing functions in which location, orientation and position of devices can have considerable advantageous and/or deleterious effects on the effectiveness with which that function is performed, such as and not limited to, the aforedescribed cases of audibly outputting audio data and capturing video images.

In the preceding discussion of both the provision and use of locality, orientation and position data, the processor 140 of the device hub 110 has tended to play little more than a supporting role in providing such data to one or more devices, and perhaps in performing some degree of modification of such data in preparation for providing such data to one or more devices. However, in alternate embodiments, the device hub 110 may directly use locality, orientation and/or position data, itself, either as part of modifying commands and/or data conveyed through the device hub 110 between devices or as part of controlling the behavior of a device. In so doing, the device hub 110 may present one device with false indications of the presence and/or capabilities of one or more other devices.

By way of example, in a variant of the assembly 1000 of FIGS. 1*a*-*d* in which a variant of the network 9000 of FIGS. 4*a*-*b* is implemented, it may be that the remote device 950 is in some way incapable of conveying audio data to more than one other device at any given time. This may stem from the remote device 950 having been intended in its design to provide audio data representing multiple audio channels to a single other device configured to audibly output all of those multiple audio channels such that the remote device 950 is in some way incapable of simultaneously conveying different pieces of audio data representing different audio channels to each of the three device 510, as has been previously discussed. To compensate for this situation in this variant of the assembly 1000, the device hub 110 may be configured to independently detect the presence of all three of the devices 510 and then falsely present the remote device 950 with an apparent indication of there being only one device present to which the remote device 950 could convey audio data representing multiple audio channels for audible output. The device hub 110 may accomplish this by first identifying the remote device 950, and upon recognizing that the remote device 950 as a device having this limitation, the device hub 110 then intervenes in tests carried out by the remote device 950 to find a single other device to which to convey audio data representing multiple audio channels for audible output and responds to those tests by presenting itself as being such a device. As the remote device 950 subsequently transmits audio data to the device hub 110 in response to being falsely informed that the device hub 110 is an appropriate audio output device, the processor 140 of the device hub 110 is caused by the routine 144 to separate the audio data received from the remote device 950 into pieces of audio data that separately represent left, right and center audio channels, and is further caused to separately provide those pieces of audio data to appropriate ones of the three devices 510.

By way of another example, in a variant of the assembly 3000 depicted in FIGS. 5*a*-*c* in which another variant of the network 9000 is implemented, it may be that neither the device 650 nor the remote device 950 are capable of correcting the orientation of video frames provided by the device 650 to the remote device 950 in response to the panel 910 being rotated between landscape and portrait modes. To compensate for this situation in this variant of the assembly 3000, the device hub 110 may be configured to intercept video frames provided by the device 650 and automatically, in response to detecting a change in orientation of the panel 910 between portrait and landscape modes, perform such a correction of those video frames before retransmitting them to the remote device 950.

Figure 7:
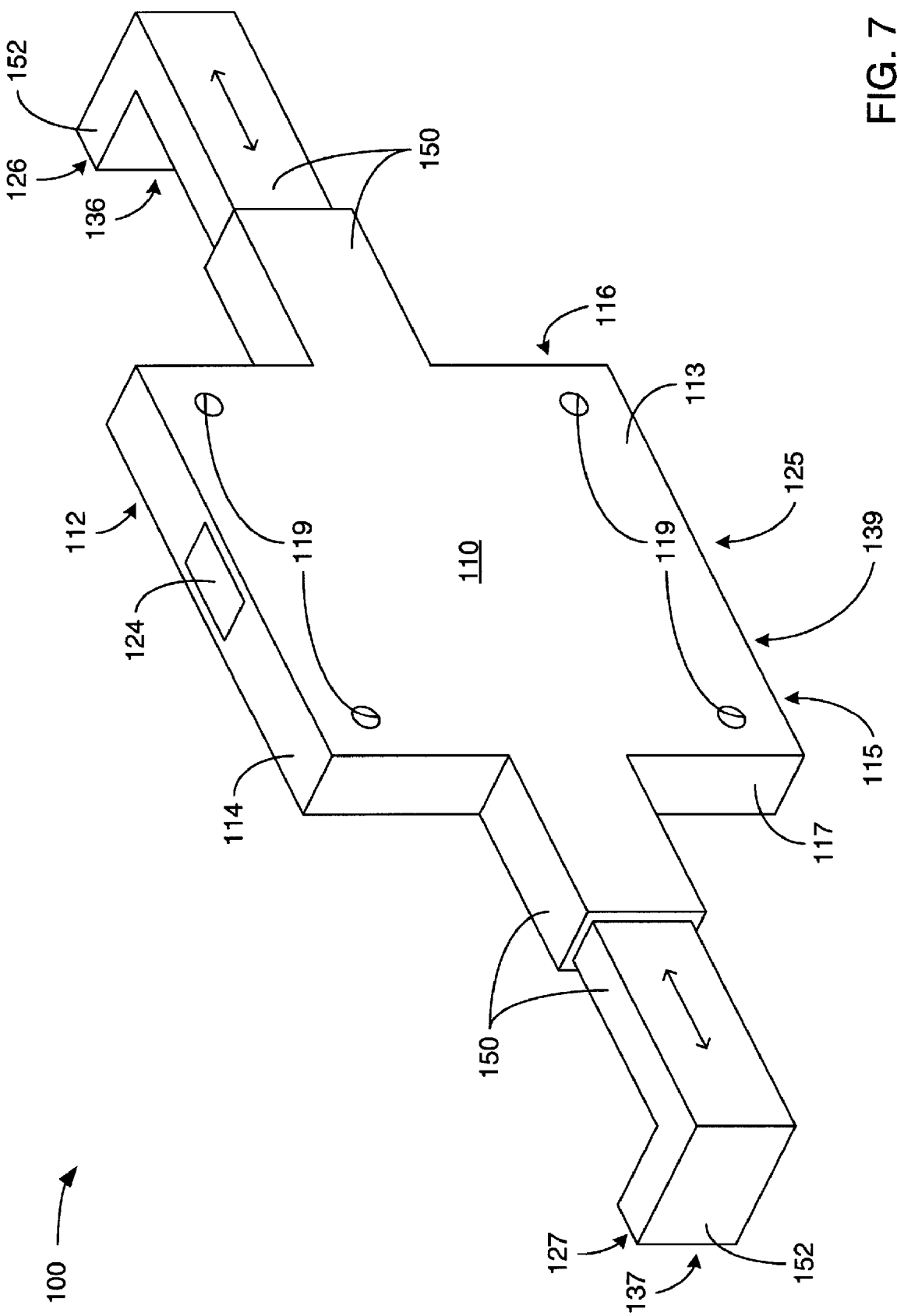
FIG. 7 is a perspective view of a bracket.

FIG. 7 depicts an alternate form of the device bracket 100 in which two of the otherwise separable arms 150 of previously depicted forms of the device bracket 100 are integral parts of the casing of the device hub 110. The couplings 124 and 125, and their accompanying connectors 134 and 135 are disposed on the top edge 114 and the bottom edge 115, respectively, as with the previously depicted forms of the device bracket 100. However, the couplings 126 and 127, along with their associated connectors 136 and 137, of this alternate device bracket 100 are disposed on ends 152 of the two arms 150 where opposing ends are integrally formed with the casing. In embodiments where the device hub 110 incorporates the ability to transmit position data to one or more devices, position sensors to detect the positions of the ends 152 of each of the integrally formed arms 150 relative to the casing of the device hub 110 are monitored by a processor of the device hub 110.

Figure 8A:
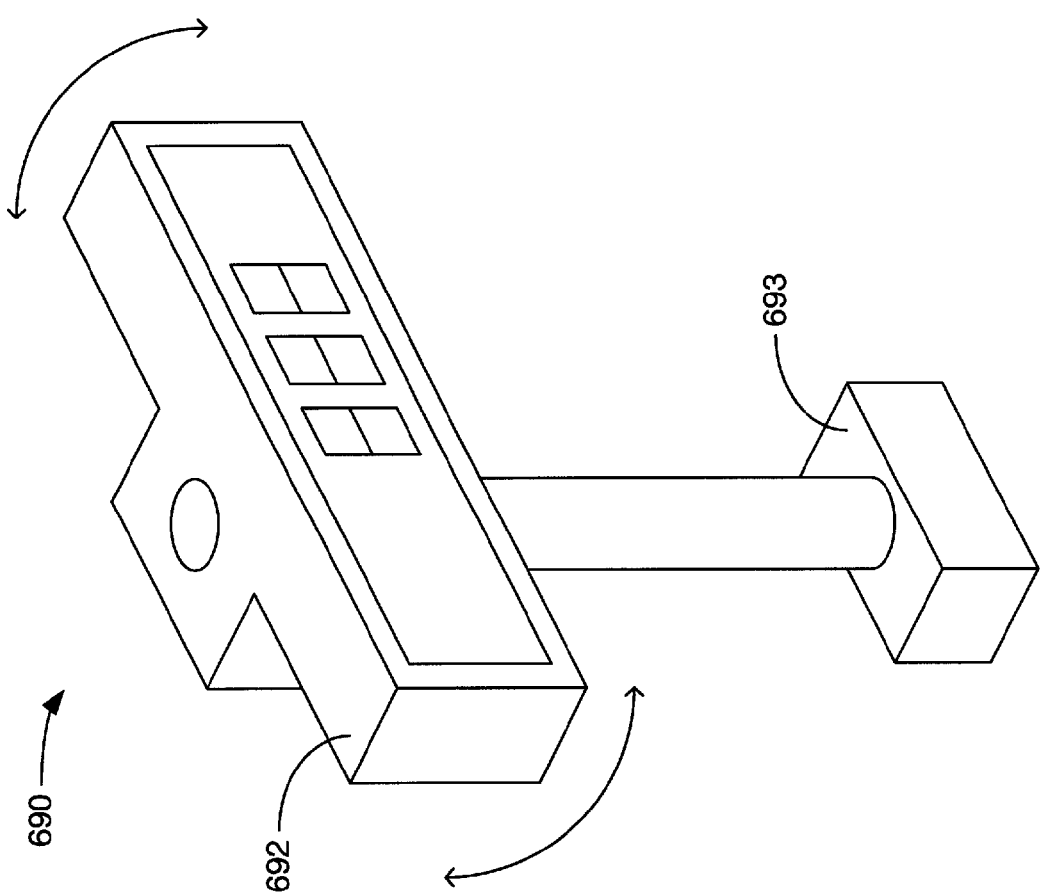
FIG. 8a is a perspective view of a device.

FIG. 8*a* depicts a device 690 meant to provide an alphanumeric visual display not unlike the typical alphanumeric displays employed in point-of-sale terminals found in commercial retail environments. Not unlike the earlier described devices 510 and 650, the device 690 is meant to be both physically and electrically coupled to a coupling and associated connector disposed on the casing of the device hub 110. However, unlike these aforedescribed devices, the device 690 incorporates its own arm that obviates the need for the device 690 to be coupled to the device hub 110 through a separate arm 150, regardless of whether that arm 150 is either integrally formed with the casing of the device hub 110 or separable from the casing of the device hub 110. Also unlike the aforedescribed devices, the device 690 is made up of two relatively movable parts, namely a stem portion 693 having an end meant to be coupled directly to a coupling of the device hub 110, and a head portion 692 capable of being rotated relative to the stem portion 693 to the direction from which the alphanumeric characters displayed by the device 690 are to be read. A position sensor (not shown) is incorporated into the device 690 to provide an indication of the position of the head portion 692 relative to the end of the stem portion 693 coupled to the device hub 110. As has been previously discussed, the device hub 110 may then modify this indication to provide one or more devices across a network with position data indicating the position of the head portion 692 relative to a reference point of the hub device 110.

Figure 8B:
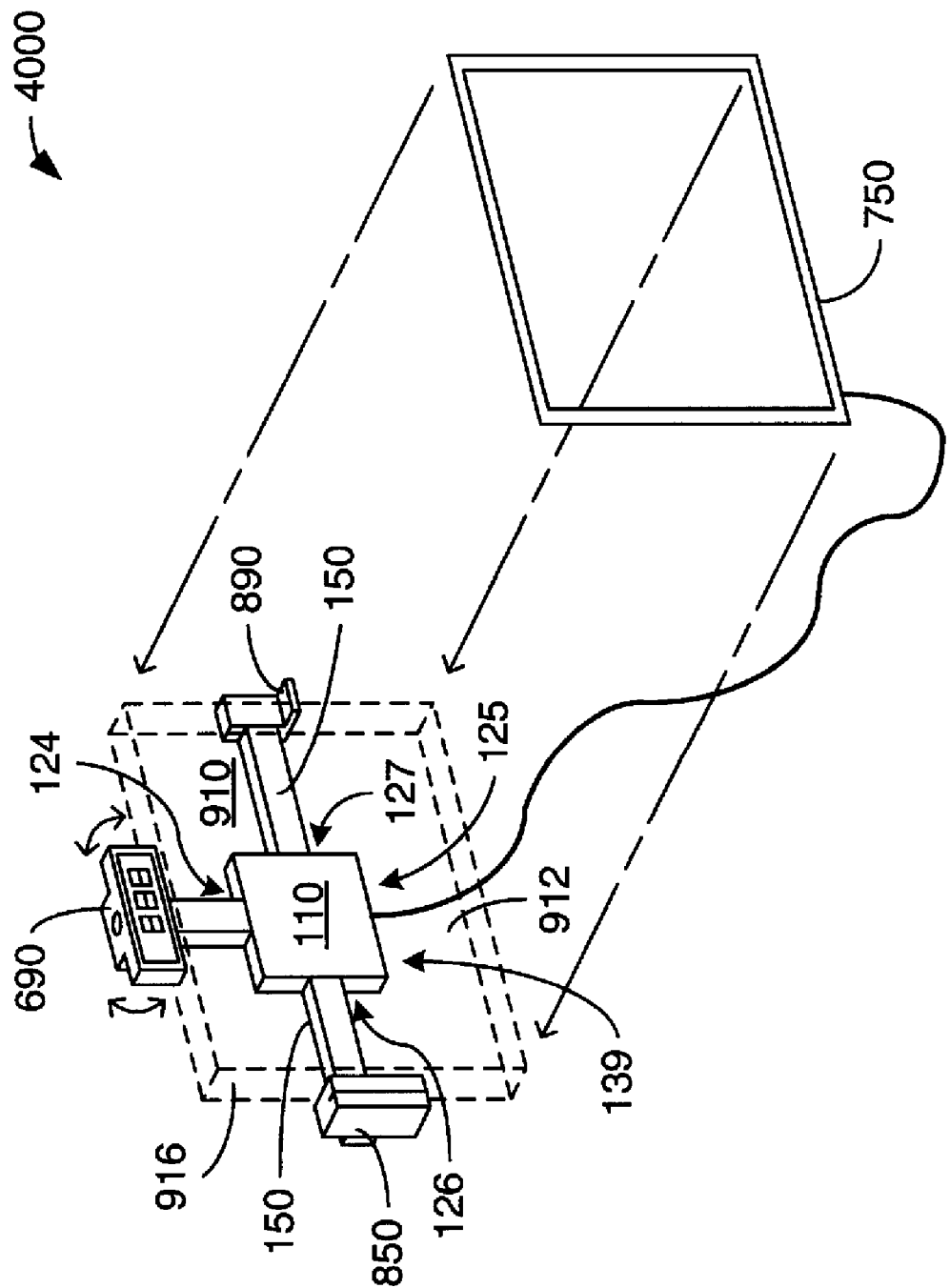
FIG. 8b is a perspective view of a portion of yet another assembly.

FIG. 8*b* depicts an assembly 4000 into which the device 690 of FIG. 8*a* is incorporated. Along with the device 690, the assembly 4000 also incorporates devices 750 (a touchscreen overlay), 850 (a card reader), and 890 (a mobile device docking cradle). The depicted assortment of devices coupled to the device hub 110 is meant to be reflective of the assortment of devices that may be desired as part of a typical point-of-sale terminal in a retail environment. As just discussed, above, the head portion 692 of the device 690 is rotatable relative to the stem portion 693, and with the stem portion 693 coupled to the device hub 10, the head portion 692 is thereby rotatable relative to the casing of the device hub 110, and the device hub 110 may be configured to provide position data indicating the position of the head portion 692 relative to a reference point of the device hub 110.

As those familiar with point-of-sale terminals will readily recognize, it is common to employ a larger display device (such as the panel 910) with a touchscreen overlay (such as the device 750) to enable a member of the staff of a retail establishment to enter retail transaction information, and it is common to employ a smaller display device (such as the device 690) to provide the more limited information required by a customer in a retail transaction, such as an amount due. However, on occasion, it is also useful for the staff member to be able to rotate the head portion 692 of the device 690 away from providing a view to the customer in order to double-check an amount being displayed to the customer. In response to detecting this change in position of the head portion 692 of the device 690, another device coupled to the device hub 110 may signal the device 690 to display additional detailed information that is normally not displayed to a customer based on the presumption that this change in position indicates that the staff member is now viewing what is displayed by the head portion 692, and not the customer.

Figure 9:
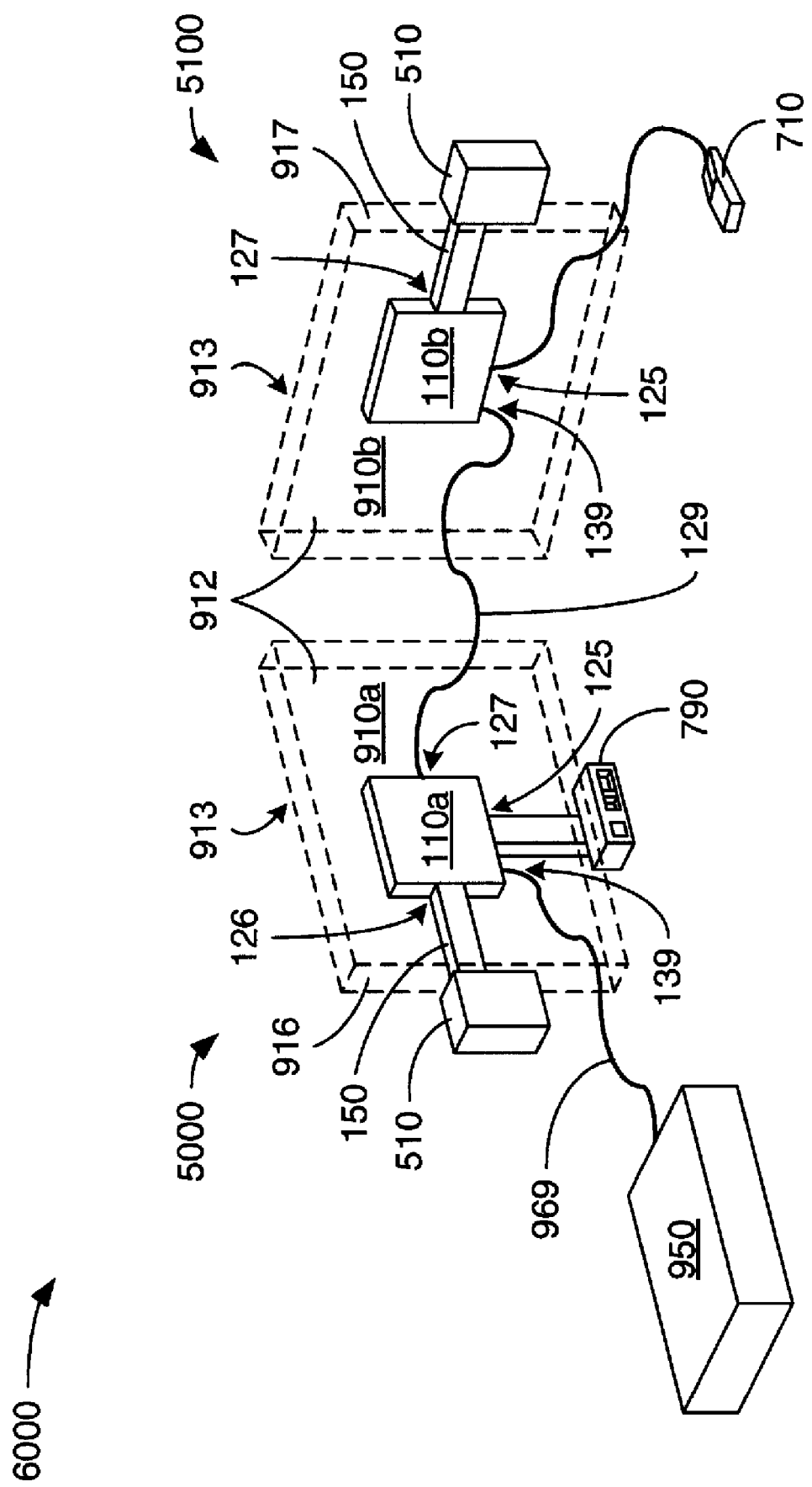
FIG. 9 is a perspective view of two interconnected assemblies.

FIG. 9 depicts a pair of assemblies 5000 and 5100 linked together and linked to a remote device 950 to form a single network 6000. The assembly 5000 incorporates a device hub 110*a*, devices 510 and 790, and a panel 910*a*. The assembly 5100 incorporates a device hub 110*b*, another device 510, a device 710, and a panel 910*b*. The panels 910*a* and 910*b* are each depicted from the perspective of their front faces 912 with broken lines allowing a view through each of the panels 910a and 910b to the 110a and 110b mounted to the rear faces 913 of each of the panels 910a and 910b, respectively. As before, each of the devices 510 is a speaker incorporating at least one acoustic driver to audibly output audio, and the device 710 is an input device in the form of a mouse or similar "pointer" device. The device 790 is a control panel providing a user with one or more manually-operable controls, including and not limited to, a pushbutton, a rocker or toggle switch, a touchpad, a thumbwheel or knob, and a joystick or rollerball. Alternatively and/or additionally, the device 790 receives signals from a hand-held remote control (not shown) via infrared, ultrasonic, radio frequency or other form of wireless signaling medium. Not unlike earlier-described networks, the remote device 950 provides audio data through the network 6000 to the pair of devices 510 with one each of the pair of devices 510 serving as separate left audio channel and right audio channel speakers. However, unlike the earlier-described networks, each one of the pair of devices 510 is coupled through one of the arms 150 to a different device hub, namely device hubs 110a and 110b, respectively.

Despite a distribution of devices among two device hubs, coordination in the operation of both of the devices 510 and the ability to provide meaningful locality, orientation and position data are enabled by the manner in which the device hubs 110a and 110b are coupled in the network 6000. In embodiments in which a master-slave configuration is employed through the network 6000, the connectors 139 of each of the devices hubs 110a and 110b may function as upstream connectors such that whatever is electrically coupled to each of these connectors 139 is treated by each of the device hubs 110a and 110b as an upstream or master device in the manner previously discussed. As depicted, the connector 139 of the device hub 110b is electrically coupled to the connector associated with the coupling 127 of the device hub 110a (namely a connector 137) via a cable 129. With devices coupled to the connectors associated with each of the couplings 124, 125, 126 and 127 being treated as downstream devices, the device hub 110b is treated as being downstream from (or a slave device of) the device hub 110a. In this master-slave relationship between the device hubs 110a and 110b, locality, orientation and/or position data is conveyed by the hub 110b to the device hub 110a, and the device hub 110a provides such data to other devices.

The device hub 110a may modify locality, orientation and/or position data received from the device hub 110b before providing such data to other devices so that such data is indicative of locality, orientation and/or position relative to the device hub 110a, rather than to the device hub 110b. In this way, the remote device 950 is still provided with such data just as would be the case if both of the devices 510 were coupled to the device hub 110a. However, although the device hub 110a may provide position data that has been modified to be relative to the device hub 110a, the device hub 110a may provide orientation data without such modifications such that where the casings of the device hubs 110a and 110b have been tilted to different angles as a result of the assemblies 5000 and 5100, respectively, being tilted to different angles, these differing angles are reflected in differing orientation data for each of the two devices 510.

In some embodiments, the device 790 may be employed to provide user input to another device, such as the remote device 950. Alternatively and/or additionally, however, the device 790 may be employed to provide user input directly to one or both of the device hubs 110a and 110b, perhaps for the purpose of providing some degree of user control over the audible output of audio data by each of the devices 510. More specifically, one or both of the device hubs 110a and 110b may be capable of acting independently of the remote device 950 (or of another device providing audio data for audible output by the devices 510) to the extent of accepting audio control input (e.g., volume, muting, balance, treble, bass, etc.) from the device 790 and modifying audio data in a manner consistent with that audio control input before conveying that audio data onward to each of the devices 510. This may be deemed desirable where the remote device 950 (or whatever other device is providing audio data to the devices 510) is in some way incapable of accepting audio control input from another device on the network 6000.

Other implementations are within the scope of the following claims and other claims to which the applicant may be entitled.

What is claimed is:

1. A device bracket comprising:
    a device hub to form a network between the device hub and at least a first device to convey electrical signals between the device hub and at least the first device, wherein:
        the device hub has a casing structured to be mounted to a flat panel display;
        the casing of the device hub has a first face, a second face, and a plurality of passages that are formed through and extend between the first and second faces; and
        the plurality of passages define corners of a rectilinear pattern on the first and second faces, and wherein the plurality of passages align with corresponding ones of a plurality of holes formed in a face of a panel of the flat panel display;
    a first coupling physically supported by the casing to enable the first device to be physically supported by the casing at a first position adjacent a first edge of the panel of the flat panel display; and
    a first connector associated with the first coupling to electrically couple the first device to the device hub.

2. The device bracket of claim 1, further comprising:
    a second coupling physically supported by the casing of the device hub to enable a second device to be physically supported by the casing at a second position adjacent a second edge of the panel of the flat panel display;
    a second connector associated with the second coupling to electrically couple the second device to the device hub, and thereby add the second device to the network; and
    wherein the device hub comprises:
        a processor; and
        a storage accessible to the processor in which a sequence of instructions is stored that when executed by the processor, causes the processor to control signals conveyed across the network with the first device through the first connector and with the second device through the second connector.

3. The device bracket of claim 2, wherein the device hub associates a first locality with the first device in response to the first device being electrically coupled to the first connector and associates a second locality with the second device in response to the second device being electrically coupled to the second connector, and wherein the device hub is structured to transmit locality data indicating the locality associated with the device across the network.

4. The device bracket of claim 2, wherein the first and second connectors each comprise at least one contact to convey a signal digitally transmitting data and each comprise at least one other contact to convey power.

5. The device bracket of claim 2, wherein the device hub is structured to employ a master-slave configuration in interacting with devices on the network, wherein the first and second connectors are structured to be downstream connectors, and wherein the device hub further comprises an upstream connector.

6. The device bracket of claim 5, wherein the device hub associates a first locality with a device if the device is electrically coupled to a downstream connector of another device hub having an upstream connector that is electrically coupled to the first connector and associates a second locality with the device if the device is electrically coupled to the second connector, and wherein the device hub is structured to transmit locality data indicating the locality associated with the device across the network.

7. The device bracket of claim 1, wherein:
the casing is structured to be mounted to a rear face of a panel of the flat panel display; and
the plurality of passages align with corresponding ones of a plurality of holes formed in a rear face of the panel of the flat panel display.

8. The device bracket of claim 7, wherein:
the plurality of passages align with corresponding ones of a plurality of holes formed in a face of a mounting plate of a support of the flat panel display; and
the casing of the device hub is structured to be interposed between the rear face of the panel and the mounting plate of the support.

9. A device bracket comprising:
a device hub to form a network between the device hub and at least a first device to convey electrical signals between the device hub and at least the first device, wherein the device hub has a casing structured to be mounted to a flat panel display;
a first coupling physically supported by the casing to enable the first device to be physically supported by the casing at a first position adjacent a first edge of the panel of the flat panel display;
a first connector associated with the first coupling to electrically couple the first device to the device hub; and
an orientation sensor to sense the orientation of the casing relative to a direction of a gravitational pull, wherein the device hub is structured to transmit orientation data indicating the orientation of the casing relative to the direction of the gravitational pull across the network.

10. The device bracket of claim 9, further comprising:
a second coupling physically supported by the casing of the device hub to enable a second device to be physically supported by the casing at a second position adjacent a second edge of the panel of the flat panel display;
a second connector associated with the second coupling to electrically couple the second device to the device hub, and thereby add the second device to the network; and
wherein the device hub comprises:
a processor; and
a storage accessible to the processor in which a sequence of instructions is stored that when executed by the processor, causes the processor to control signals conveyed across the network with the first device through the first connector and with the second device through the second connector.

11. The device bracket of claim 10, wherein the device hub associates a first locality with the first device in response to the first device being electrically coupled to the first connector and associates a second locality with the second device in response to the second device being electrically coupled to the second connector, and wherein the device hub is structured to transmit locality data indicating the locality associated with the device across the network.

12. The device bracket of claim 10, wherein the device hub is structured to employ a master-slave configuration in interacting with devices on the network, wherein the first and second connectors are structured to be downstream connectors, and wherein the device hub further comprises an upstream connector.

13. A device bracket comprising:
a device hub to form a network between the device hub and at least a first device to convey electrical signals between the device hub and at least the first device, wherein the device hub has a casing structured to be mounted to a flat panel display;
a first coupling physically supported by the casing to enable the first device to be physically supported by the casing at a first position adjacent a first edge of the panel of the flat panel display;
a first connector associated with the first coupling to electrically couple the first device to the device hub; and
wherein:
the device hub further comprises a first arm to physically support the first coupling and the first connector at the first position;
the first arm comprises an elongate body having an end structured to be movable relative to the casing;
the first coupling is disposed on the end and a position sensor is disposed on the elongate body of the arm to provide an indication of the position of the end relative to a portion of the casing; and
the device hub is structured to transmit position data indicating the position of the end relative to a reference point of the casing of the device hub across the network.

14. The device bracket of claim 13, further comprising:
a second coupling physically supported by the casing of the device hub to enable a second device to be physically supported by the casing at a second position adjacent a second edge of the panel of the flat panel display;
a second connector associated with the second coupling to electrically couple the second device to the device hub, and thereby add the second device to the network; and
wherein the device hub comprises:
a processor; and
a storage accessible to the processor in which a sequence of instructions is stored that when executed by the processor, causes the processor to control signals conveyed across the network with the first device through the first connector and with the second device through the second connector.

15. The device bracket of claim 14, wherein the device hub associates a first locality with the first device in response to the first device being electrically coupled to the first connector and associates a second locality with the second device in response to the second device being electrically coupled to the second connector, and wherein the device hub is structured to transmit locality data indicating the locality associated with the device across the network.

16. The device bracket of claim 14, wherein the device hub is structured to employ a master-slave configuration in interacting with devices on the network, wherein the first and second connectors are structured to be downstream connectors, and wherein the device hub further comprises an upstream connector.

17. A device bracket comprising:
a device hub to form a network between the device hub and at least a first device to convey electrical signals between the device hub and at least the first device, wherein the device hub has a casing structured to be mounted to a flat panel display;
a first coupling physically supported by the casing to enable the first device to be physically supported by the casing at a first position adjacent a first edge of the panel of the flat panel display;
a first connector associated with the first coupling to electrically couple the first device to the device hub; and
a first arm that is separable from the casing of the device hub and that cooperates with the casing of the device hub to physically support the first coupling and the first connector at the first position when coupled to the casing, wherein the first arm comprises:
a first end;
a second end structured to be movable relative to the first end, wherein the first coupling is disposed on the second end; and
a position sensor disposed on the first arm to provide an indication to the device hub of the position of the second end relative to the first end.

18. The device bracket of claim 17, wherein the device hub is structured to transmit position data indicating the position of the second end of the first arm relative to a reference point of the casing of the device hub.

19. The device bracket of claim 17, further comprising:
a second coupling physically supported by the casing of the device hub to enable a second device to be physically supported by the casing at a second position adjacent a second edge of the panel of the flat panel display;
a second connector associated with the second coupling to electrically couple the second device to the device hub, and thereby add the second device to the network; and
wherein the device hub comprises:
a processor; and
a storage accessible to the processor in which a sequence of instructions is stored that when executed by the processor, causes the processor to control signals conveyed across the network with the first device through the first connector and with the second device through the second connector.

20. The device bracket of claim 19, wherein the device hub associates a first locality with the first device in response to the first device being electrically coupled to the first connector and associates a second locality with the second device in response to the second device being electrically coupled to the second connector, and wherein the device hub is structured to transmit locality data indicating the locality associated with the device across the network.

21. The device bracket of claim 19, wherein the device hub is structured to employ a master-slave configuration in interacting with devices on the network, wherein the first and second connectors are structured to be downstream connectors, and wherein the device hub further comprises an upstream connector.

22. An arm comprising:
an elongate body having a first end and a second end;
a first coupling at the first end to couple the arm to a casing of a device hub mountable to a flat panel display;
a second coupling at the second end to couple the arm to a casing of a device to enable the arm to cooperate with the casing of the device hub to physically support the device at a position adjacent the flat panel display, wherein the arm is structured to enable the second coupling to be moved relative to the first coupling;
a first connector associated with the first coupling to electrically couple the arm to the device hub;
a second connector associated with the second coupling to electrically couple the arm to the device, wherein the first and second connectors are electrically coupled to enable an electrical signal to be conveyed between the device hub and the device; and
a position sensor to provide the device hub an indication of the position of the second coupling relative to the first coupling.

23. The arm of claim 22, wherein the arm is structured to cooperate with the casing of the device hub to physically support the device at a position adjacent an edge of the panel of the flat panel display.

24. The arm of claim 22 further comprising a storage to enable the provision of a piece of data to the device hub regarding a characteristic of the position sensor.

25. A device comprising:
a casing;
a coupling disposed on the casing of the device to enable the device to be physically supported at a position adjacent an edge of a flat panel of a flat panel display by a casing of a device hub mounted to the flat panel display; and
a connector associated with the coupling to enable the device to be electrically coupled to the device hub to enable an electrical signal to be conveyed between the device and the device hub to form a network between the device hub and at least the device, wherein the casing of the device incorporates an arm having an end on which the coupling and the connector are disposed.

26. The device of claim 25, wherein the end of the arm is movable relative to another portion of the casing of the device, and the device further comprises a position sensor to provide an indication of the position of the end relative to the another portion of the casing.

27. The device of claim 26, wherein the device is structured to transmit position data indicating the position of the end relative to the another portion of the device casing across the network at a time when the device is physically supported by the device hub.

28. The device of claim 25, further comprising an acoustic driver to audibly output a piece of audio data received through the connector.

29. The device of claim 25, further comprising a microphone to capture audio.

30. The device of claim 25, further comprising a camera to capture visual imagery.

31. The device of claim 25, further comprising a manually operable control.

* * * * *